(12) United States Patent
Lee et al.

(10) Patent No.: US 9,911,777 B2
(45) Date of Patent: Mar. 6, 2018

(54) IMAGE SENSORS USING DIFFERENT PHOTOCONVERSION REGION ISOLATION STRUCTURES FOR DIFFERENT TYPES OF PIXEL REGIONS

(71) Applicant: Samsung Electronics Co., Ltd., Suwon-si, Gyeonggi-do (KR)

(72) Inventors: Kyungho Lee, Suwon-si (KR); Seounghyun Kim, Hwaseong-si (KR); Hyuk An, Seoul (KR); Yun Ki Lee, Seoul (KR); Hyuk Soon Choi, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/290,560

(22) Filed: Oct. 11, 2016

(65) Prior Publication Data

US 2017/0104020 A1 Apr. 13, 2017

(30) Foreign Application Priority Data

Oct. 12, 2015 (KR) .......................... 10-2015-0142310

(51) Int. Cl.
*H01L 31/062* (2012.01)
*H01L 27/146* (2006.01)

(52) U.S. Cl.
CPC ...... *H01L 27/1463* (2013.01); *H01L 27/1461* (2013.01); *H01L 27/1464* (2013.01); *H01L 27/14605* (2013.01); *H01L 27/14607* (2013.01); *H01L 27/14621* (2013.01); *H01L 27/14627* (2013.01)

(58) Field of Classification Search
CPC ........... H01L 27/14607; H01L 27/1463; H01L 27/14621; H01L 27/1461
USPC .......................................................... 257/292
See application file for complete search history.

(56) References Cited

U.S. PATENT DOCUMENTS

| | | |
|---|---|---|
| 6,903,391 B2 | 6/2005 | Takeuchi et al. |
| 7,071,501 B2 | 7/2006 | Jang |
| 7,518,172 B2 | 4/2009 | Moon et al. |
| 7,742,088 B2 | 6/2010 | Shizukuishi |
| 8,426,238 B2 | 4/2013 | Nishizawa et al. |
| 8,736,005 B2 | 5/2014 | Kobayashi et al. |
| 8,860,099 B2 | 10/2014 | Tatani et al. |
| 9,054,004 B2 | 6/2015 | Yang |

(Continued)

FOREIGN PATENT DOCUMENTS

| | | |
|---|---|---|
| JP | 2013-211413 | 10/2013 |
| KR | 10-20090070741 A | 7/2009 |

*Primary Examiner* — Andy Huynh
(74) *Attorney, Agent, or Firm* — Ward and Smith, P.A.

(57) ABSTRACT

An image sensor includes a semiconductor substrate, a first pair of photoelectric conversion regions in a first pixel region of the substrate and a first isolation structure between the photoelectric conversion regions of the first pair of photoelectric conversion regions. The sensor further includes a second pair of photoelectric conversion regions in a second pixel region of the substrate adjacent the first pixel region and a second isolation structure between the photoelectric conversion regions of the second pair of photoelectric conversion regions and having different optical properties than the first isolation structure. First and second different color filters (e.g., green and red) may be disposed on respective ones of the first and second pixel regions.

20 Claims, 24 Drawing Sheets

(56) References Cited

U.S. PATENT DOCUMENTS

| | | | |
|---|---|---|---|
| 2011/0156186 A1* | 6/2011 | Iida | H01L 27/1463 257/432 |
| 2012/0199882 A1* | 8/2012 | Shin | H01L 27/14607 257/222 |
| 2013/0182158 A1 | 7/2013 | Kobayashi et al. | |
| 2014/0110809 A1* | 4/2014 | Kitamura | H01L 27/14623 257/435 |
| 2014/0160335 A1 | 6/2014 | Shimotsusa | |
| 2014/0361355 A1* | 12/2014 | Shin | H01L 27/1463 257/292 |
| 2014/0374868 A1* | 12/2014 | Lee | H01L 27/1463 257/446 |
| 2015/0002713 A1 | 1/2015 | Nomura | |
| 2016/0049430 A1* | 2/2016 | Nomura | H01L 27/14623 257/432 |

\* cited by examiner

FIG. 4A

| B | G | B | G | B | G | B | G |
|---|---|---|---|---|---|---|---|
| G | R | G | R | G | R | G | R |
| B | G | B | G | B | G | B | G |
| G | R | G | R | G | R | G | R |

| G | R | G | R | G | R | G | R |
|---|---|---|---|---|---|---|---|
| B | W | B | W | B | W | B | W |
| G | R | G | R | G | R | G | R |
| B | W | B | W | B | W | B | W |

| G | R | G | R | G | R | G | R |
|---|---|---|---|---|---|---|---|
| B | Z | B | Z | B | Z | B | Z |
| G | R | G | R | G | R | G | R |
| B | Z | B | Z | B | Z | B | Z |

| G | R | G | R | G | R | G | R |
|---|---|---|---|---|---|---|---|
| B | Z | | G | B | Z | | G |
| G | | | R | G | | | R |
| B | G | B | G | B | G | B | G |

D2 → D1

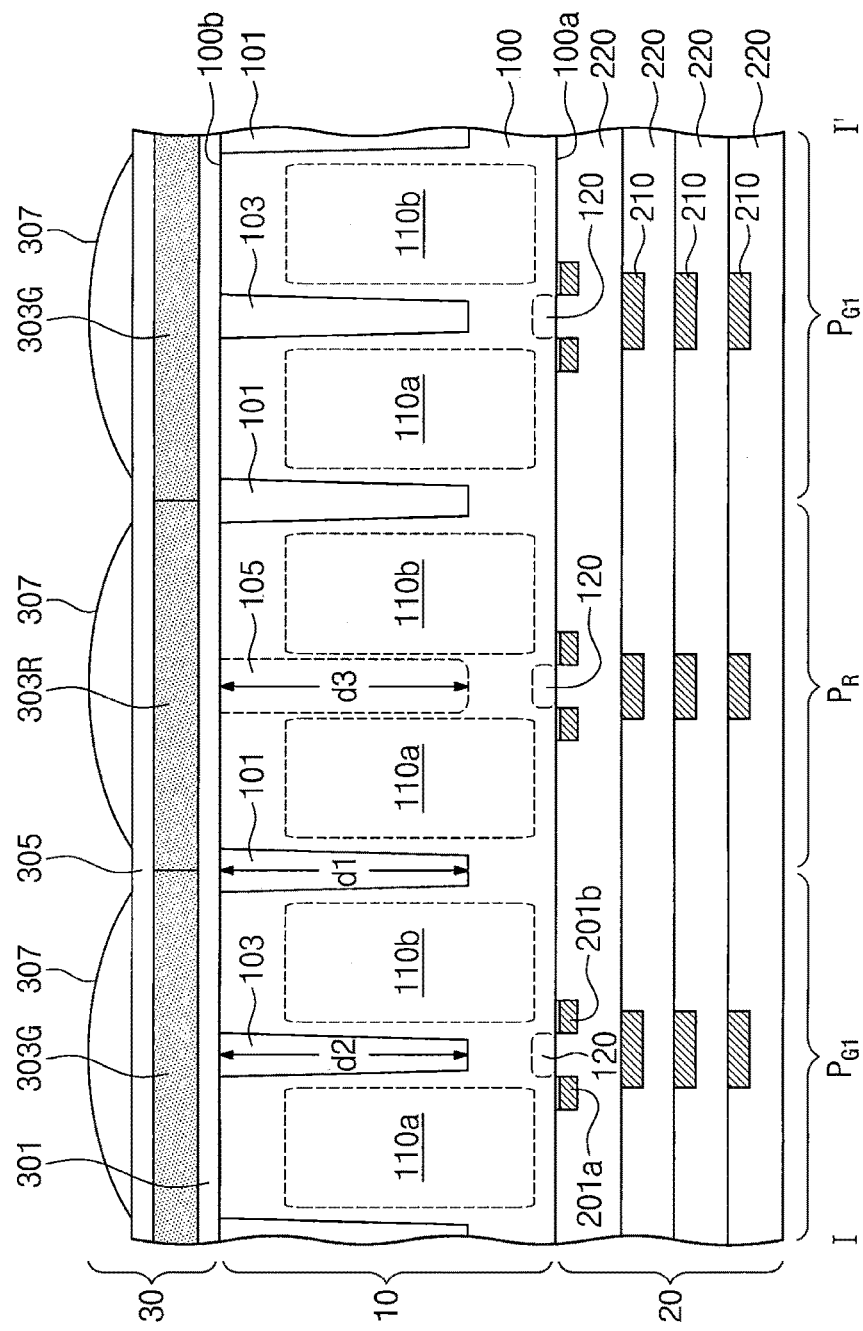

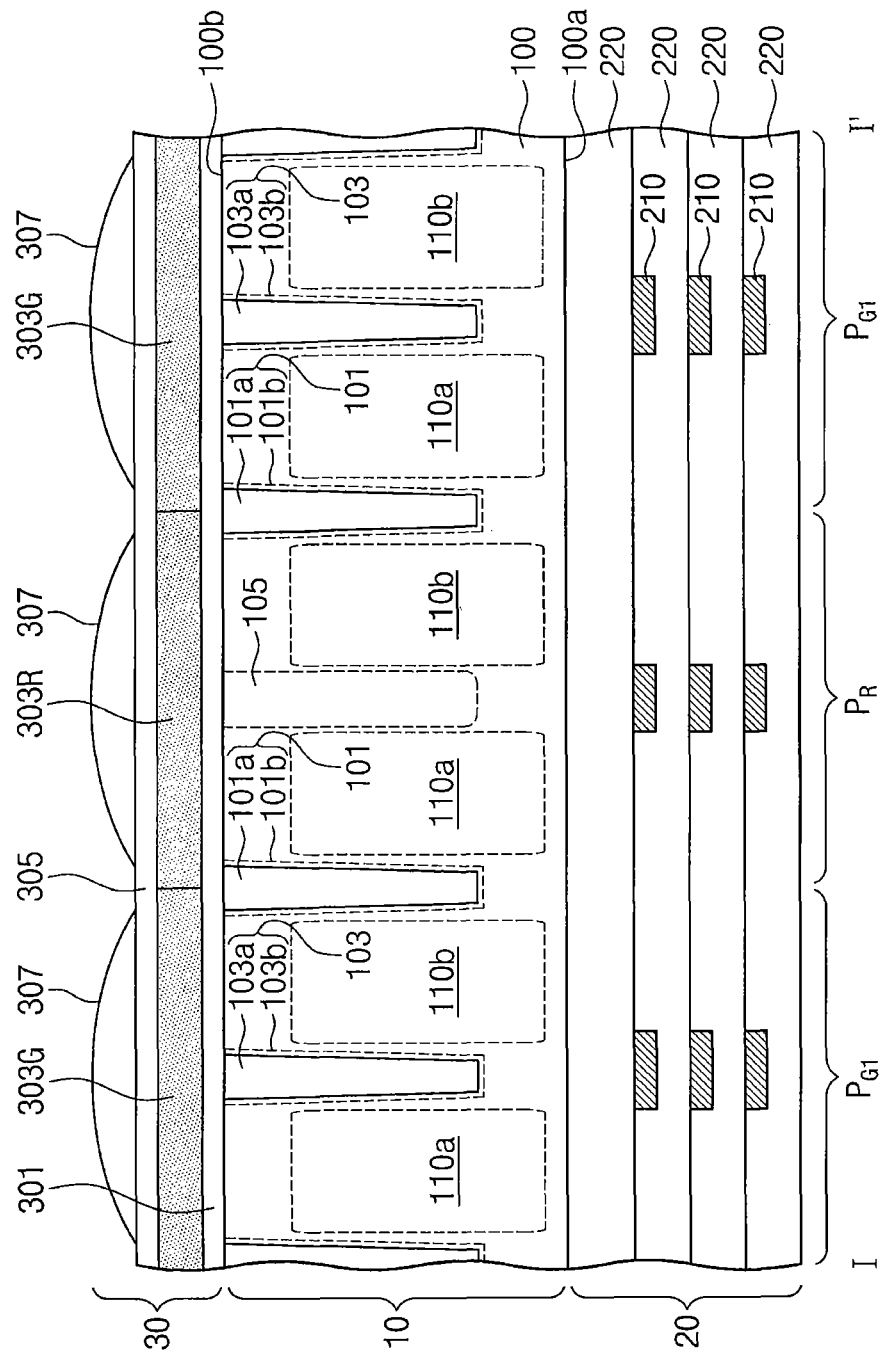

IMAGE SENSORS USING DIFFERENT PHOTOCONVERSION REGION ISOLATION STRUCTURES FOR DIFFERENT TYPES OF PIXEL REGIONS

CROSS-REFERENCE TO RELATED APPLICATIONS

This U.S. non-provisional patent application claims priority under 35 U.S.C. § 119 to Korean Patent Application No. 10-2015-0142310, filed on Oct. 12, 2015, in the Korean Intellectual Property Office, the entire contents of which are hereby incorporated by reference.

BACKGROUND

The disclosure relates to image sensors and, more particularly, to image sensors using paired photoconversion devices for auto-focusing (AF) and other functions.

An image sensor is a device that converts optical images into electrical signals. With increased development of the computer and communications industries, there is an increased demand for high performance image sensors in a variety of applications such as digital cameras, camcorders, personal communication systems, gaming machines, security cameras, micro-cameras for medical applications, and/or robots. Accordingly, there is an increasing demand for imaging devices or image sensors with high performance.

SUMMARY

Some example embodiments of the inventive concepts an image sensor with improved optical characteristics.

In some embodiments, an image sensor includes a semiconductor substrate of a first conductivity type and a device separation layer disposed in the semiconductor substrate and defining first pixel regions and second pixel regions therein. The image sensor further includes respective pairs of first and second photoelectric conversion devices of a second conductivity type disposed in the semiconductor substrate in respective ones of the first and second pixel regions. Respective first isolation structures are disposed in the semiconductor substrate between the first and second photoelectric conversion devices in respective ones of the first pixel regions and respective second isolation structures are disposed in the semiconductor substrate between the first and second photoelectric conversion devices in respective ones of the second pixel regions, the second isolation structures being different from the first isolation structures in terms of their refractive indices and/or shapes. The first and second pixel regions are arranged in a matrix along first and second orthogonal directions and the second pixel regions are disposed between adjacent ones of the first pixel regions along the first direction and between adjacent ones of the first pixel regions along the second direction.

In some embodiments, the first isolation structures may include insulating layers having a line-shaped structure extending along the second direction, and the second isolation structures may include line-shaped structures extending along the second direction and include impurity regions including dopants of the first conductivity type. In some embodiments, the first isolation structures may include insulating layers having a line-shaped structure extending along the second direction, and the second isolation structures may include insulating layers including first portions extending along the first direction and second portions extending along the second direction.

In some embodiments, the device separation layer may include first portions extending along the first direction and spaced apart from each other along the second direction and second portions extending along the second direction and spaced apart from each other along the first direction. The first and second isolation structures may extend along the second direction to contact the first portions of the device separation layer. In the first pixel regions, the first and second photoelectric conversion devices may be individually enclosed by the device separation layer and the first isolation structures and, in the second pixel regions, the first and second photoelectric conversion devices may be individually enclosed by the device separation layer and the second isolation structure.

In some embodiments, the semiconductor substrate may have a first surface and a second surface on first and second opposite sides thereof. The device separation layer may have a bottom surface spaced apart from the second surface of the semiconductor substrate by a first distance, the second isolation structures may have bottom surfaces spaced apart from the second surface of the semiconductor substrate by second distance, and the second distance may be substantially the same as the first distance. The first isolation structures may have bottom surfaces spaced apart from the second surface of the semiconductor substrate by the first distance.

According to further embodiments, the semiconductor substrate may further include third pixel regions defined by the device separation layer and disposed in a diagonal direction to the second pixel regions between adjacent ones of the first pixel regions along the first direction and between adjacent ones of the first pixel regions along the second direction, and wherein the image sensor further includes third isolation structures disposed in the semiconductor substrate between the first and second photoelectric conversion devices in respective ones of the third pixel regions. In some embodiments, the third isolation structures may have the same material composition or shape as the first isolation structures. In further embodiments, the third isolation structures may have the same material composition or shape as the second isolation structures. The third isolation structures may have a different material composition or shape than the first and second isolation structures.

In some embodiments, the first and third isolation structures may include insulating layers having a line-shaped structure extending along the second direction and the second isolation structures may have a line-shaped structure extending along the second direction and include impurity regions including dopants of the first conductivity type.

In some embodiments, the first isolation structures may include insulating layers having a line-shaped structure extending along the second direction. The second and third isolation structures may have a line-shaped structure extending along the second direction and include impurity regions including dopants of the first conductivity type.

In some embodiments, the first and third isolation structures may include insulating layers having a line-shaped structure extending along the second direction. The second isolation structures may include insulating layers including first portions extending along the first direction and second portions extending along the second direction.

In some embodiments, the first isolation structures may include insulating layers having a line-shaped structure extending along the second direction. The second and third isolation structures may include insulating layers, and the insulating layers of the second isolation structures may include first portions extending along the first direction and second portions extending along the second direction.

In some embodiments, the first isolation structures may include insulating layers having a line-shaped structure extending along the second direction, wherein the second isolation structures have a line-shaped structure extending along the second direction and include impurity regions including dopants of the first conductivity type. The third isolation structures may include insulating layers including first portions extending along the first direction and second portions extending along the second direction.

In some embodiments, the first isolation structures may have a line-shaped structure extending along the second direction and include impurity regions including dopants of the first conductivity type. The second and third isolation structures may include insulating layers including first portions extending along the first direction and second portions extending along the second direction.

In further embodiments, the semiconductor substrate may have a first surface and a second surface on opposite sides thereof. The image sensor may further include an interconnection structure on the first surface of the semiconductor substrate and including a plurality of interconnection lines electrically connected to the first and second photoelectric conversion devices and an optically-transparent layer on the second surface of the semiconductor substrate and including respective color filters and respective micro lenses disposed on the first and second pixel regions. The micro lenses may overlap the first and second photoelectric conversion layers of the first and second pixel regions. The color filters may include green filters, red filters, and blue filters. The green filters may be disposed on the first pixel regions and the red filters may be disposed on the second pixel regions.

Additional embodiments provide an image sensor including a semiconductor substrate of a first conductivity type and a device separation layer in the semiconductor substrate and defining first pixel regions and second pixel regions therein. The image sensor further includes respective pairs of first and second photoelectric conversion devices of a second conductivity type in respective ones of the first and second pixel regions. Respective first isolation structures are disposed in the semiconductor substrate between the first and second photoelectric conversion devices in respective ones of the first pixel regions, the first isolation structures including an insulating material. Respective second isolation structures are disposed in the semiconductor substrate between the first and second photoelectric conversion devices in respective ones of the second pixel regions, the second isolation structures including a material having a refractive index different from the first isolation structures. The first and second pixel regions are arranged in a matrix along first and second orthogonal directions and the second pixel regions are disposed between adjacent ones of the first pixel regions along the first direction and between adjacent ones of the first pixel regions along the second direction.

In some embodiments, the device separation layer and the first isolation structures may include insulating layers having a line-shaped structure extending along the second direction. The second isolation structures may have a line-shaped structure extending along the second direction and include impurity regions including dopants of the first conductivity type.

In some embodiments, the device separation layer may include first portions extending along the first direction and spaced apart from each other in the second direction and second portions extending along the second direction and spaced apart from each other in the first direction. The first and second isolation structures may extend in the second direction to contact the first portions of the device separation layer.

In some embodiments, the semiconductor substrate may have a first surface and a second surface on opposite sides thereof, and the device separation layer and the first isolation structures may have bottom surfaces spaced apart from the second surface of the semiconductor substrate by a first distance. The second isolation structures may have bottom surfaces spaced apart from the second surface of the semiconductor substrate by a second distance. The second distance may be substantially the same as the first distance.

In some embodiments, the semiconductor substrate may further include third pixel regions defined by the device separation layer. The third pixel regions may be disposed in a diagonal direction to the second pixel regions between adjacent ones of the first pixel regions along the first direction and between adjacent ones of the first pixel regions along the second direction, and wherein the image sensor further includes respective third isolation structures in respective ones of the third pixel regions between the first and second photoelectric conversion devices thereof.

In some embodiments, the third isolation structures may extend along the second direction parallel to the first isolation structures and include the same insulating material as the first isolation structures. In further embodiments, the third isolation structures may extend along the second direction parallel to the second isolation structures and include impurity regions including dopants of the first conductivity type.

Additional embodiments may provide an image sensor including a semiconductor substrate of a first conductivity type and a device separation layer in the semiconductor substrate and defining first pixel regions and second pixel regions therein. Respective pairs of first and second photoelectric conversion devices of a second conductivity type are disposed in respective ones of the first and second pixel regions. Respective first isolation structures are disposed in the semiconductor substrate between the first and second photoelectric conversion devices in respective ones of the first pixel regions, the first isolation structures including an insulating material. Respective second isolation structures are disposed in respective ones of the second pixel regions, the second isolation structures including an insulating material and including first portions disposed between the first and second photoelectric conversion devices and second portions crossing the first and second photoelectric conversion devices. The first and second pixel regions are arranged in a matrix along first and second orthogonal directions. The second pixel regions are disposed between adjacent ones of the first pixel regions along the first direction and between adjacent ones of the first pixel regions in the second direction.

In some embodiments, the device separation layer may include first portions extending along the first direction and spaced apart from each other in the second direction and second portions extending along the second direction and spaced apart from each other in the first direction. The first isolation structures may extend along the second direction to contact the first portions of the device separation layer. The first portions of the second isolation structures may be in contact with the first portions of the device separation layer. The second portions of the second isolation structures may be in contact with the second portions of the device separation layer.

In further embodiments, the semiconductor substrate may further include third pixel regions defined by the device separation layer. The third pixel regions may be disposed in a diagonal direction to the second pixel regions, between adjacent ones of the first pixel regions along the first direction, and between adjacent ones of the first pixel regions along the second direction. The image sensor may further include respective third isolation structures in respective ones of the third pixel regions between the first and second photoelectric conversion devices. The third isolation structures may extend parallel to the first isolation structures and in the second direction and may include an insulating material. The third isolation structures may extend parallel to the second isolation structures in the second direction and may include impurity regions including dopants of the first conductivity type. The third isolation structures may include an insulating material and may include first portions disposed between the first and second photoelectric conversion devices and second portions crossing the first and second photoelectric conversion devices.

Further embodiments provide an image sensor including a semiconductor substrate, a first pair of photoelectric conversion regions in a first pixel region of the substrate and a first isolation structure between the photoelectric conversion regions of the first pair of photoelectric conversion regions. The sensor further includes a second pair of photoelectric conversion regions in a second pixel region of the substrate adjacent the first pixel region and a second isolation structure between the photoelectric conversion regions of the second pair of photoelectric conversion regions and having different optical properties than the first isolation structure. First and second different color filters may be disposed on respective ones of the first and second pixel regions.

In some embodiments, the first isolation structure may include an insulating region in a trench in the substrate between the photoelectric conversion regions of the first pair of photoelectric conversion regions. The second isolation structure may include a doped region in the substrate between the photoelectric conversion regions of the second pair of photoelectric conversion regions. First and second different color filters may be disposed on respective ones of the first and second pixel regions. The first color filter may be a green color filter and the second color filter may be a red color filter. The image sensor may further include a device separation layer individually surrounding each of the first and second pairs of photoelectric conversion regions and having substantially the same depth as the insulating region of the second isolation structure.

In some embodiments, the first isolation structure may include multiple layers having different refractive indices disposed in a first trench in the substrate between the photoelectric conversion regions of the first pair of photoelectric conversion regions. The second isolation structure may include a doped region in the substrate between the photoelectric conversion regions of the second pair of photoelectric conversion regions. First and second different color filters may be disposed on respective ones of the first and second pixel regions. The first color filter may be a green color filter and the second color filter may be a red color filter. The image sensor may further include a device separation layer individually surrounding each of the first and second pairs of photoelectric conversion regions and including multiple layers having different refractive indices disposed in a second trench in the substrate.

In further embodiments, the first isolation structure may include a first insulating region in a first trench in the substrate between the photoelectric conversion regions of the first pair of photoelectric conversion regions. The second isolation structure may include a second insulation region in a second trench in the substrate between the photoelectric conversion regions of the second pair of photoelectric conversion regions and a third insulating region in a third trench crossing the second trench and partially extending into the photoelectric conversion regions of the second pair of photoelectric conversion regions.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIGS. 4A to 4D are plan views illustrating some examples of a color filter array of an image sensor according to some example embodiments of the inventive concepts.

FIGS. 6A and 6B are sectional views, which are taken along lines I-I' and II-II', respectively, of FIG. 5A or 5B and illustrate image sensors according to some example embodiments of the inventive concepts.

FIGS. 7A to 7F are sectional views, which are taken along line I-I' of FIG. 5A or 5B and illustrate image sensors according to some example embodiments of the inventive concepts.

Figure 1:
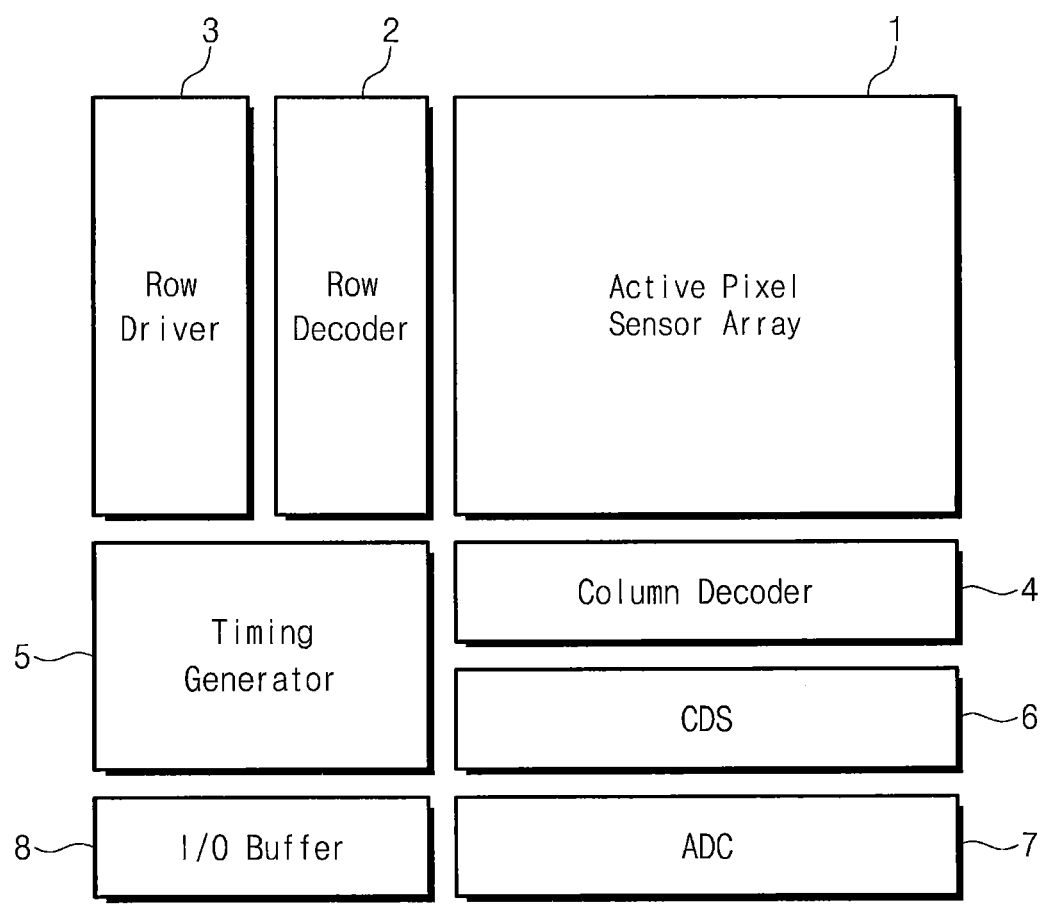
FIG. 1 is a block diagram of an image sensor according to some example embodiments of the inventive concepts.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or

DETAILED DESCRIPTION

The inventive concepts will now be described more fully hereinafter with reference to the accompanying drawings, in which exemplary embodiments of the inventive concepts are shown. The inventive concepts and methods of achieving them will be apparent from the following exemplary embodiments that will be described in more detail with reference to the accompanying drawings. The embodiments of the inventive concepts may, however, be embodied in different forms and should not be constructed as limited to the embodiments set forth herein. Rather, these embodiments are provided so that this disclosure will be thorough and complete, and will fully convey the scope of the inventive concept to those skilled in the art.

As used herein, the singular terms "a," "an" and "the" are intended to include the plural forms as well, unless the context clearly indicates otherwise. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. Additionally, the embodiment in the detailed description will be described with sectional views as ideal exemplary views of the inventive concepts. Accordingly, shapes of the exemplary views may be modified according to manufacturing techniques and/or allowable errors. Therefore, the embodiments of the inventive concepts are not limited to the specific shape illustrated in the exemplary views, but may include other shapes that may be created according to manufacturing processes.

Exemplary embodiments of aspects of the present inventive concepts explained and illustrated herein include their complementary counterparts. The same reference numerals or the same reference designators denote the same elements throughout the specification.

FIG. 1 is a block diagram of an image sensor according to some example embodiments of the inventive concepts. Referring to FIG. 1, an image sensor may include an active pixel sensor array 1, a row decoder 2, a row driver 3, a column decoder 4, a timing generator 5, a correlated double sampler (CDS) 6, an analog-to-digital converter (ADC) 7, and an input/output (I/O) buffer 8.

The active pixel sensor array 1 may include a plurality of unit pixels that are arranged two-dimensionally and may convert optical signals to electrical signals. The active pixel sensor array 1 may be driven by a plurality of driving signals, such as a pixel selection signal, a reset signal, and a charge transmission signal, which are transmitted from the row driver 3. The converted electrical signal may the CDS 6.

In some example embodiments, the image sensor may be configured to detect a difference in phase of light to be incident into the active pixel sensor array 1 and thereby to perform an auto focusing operation using the phase difference detection. Each of the unit pixels of the active pixel sensor array 1 may be configured to generate and output a focus signal from a difference in phase of light to be incident into a pair of photoelectric conversion devices. The focus signal may be used to perform the auto-focusing operation for adjusting a position of a lens of an imaging device.

The row driver 3 may be configured to provide the driving signals for driving the plurality of unit pixels to the active pixel sensor array 1, based on the result decoded by the row decoder 2. In the case where the unit pixels are arranged in a matrix shape, the driving signals may be supplied to respective rows of the unit pixels.

The timing generator 5 may be configured to provide timing and control signals to the row decoder 2 and the column decoder 4.

The CDS 6 may be configured to receive the electric signals generated in the active pixel sensor array 1 and perform a holding and sampling operation on the received electric signals. For example, the CDS 6 may perform a double sampling operation on a specific noise level and a signal level of the electric signal to output a difference level corresponding to a difference between the noise and signal levels.

The ADC 7 may be configured to convert analog signals, which correspond to the difference level output from the CDS 6, into digital signals, and then to output the converted digital signals to the I/O buffer 8.

The I/O buffer 8 may be configured to latch the digital signal and to sequentially output the latched digital signals to an image signal processing unit (not shown), based on the result decoded by the column decoder 4.

Figure 2:
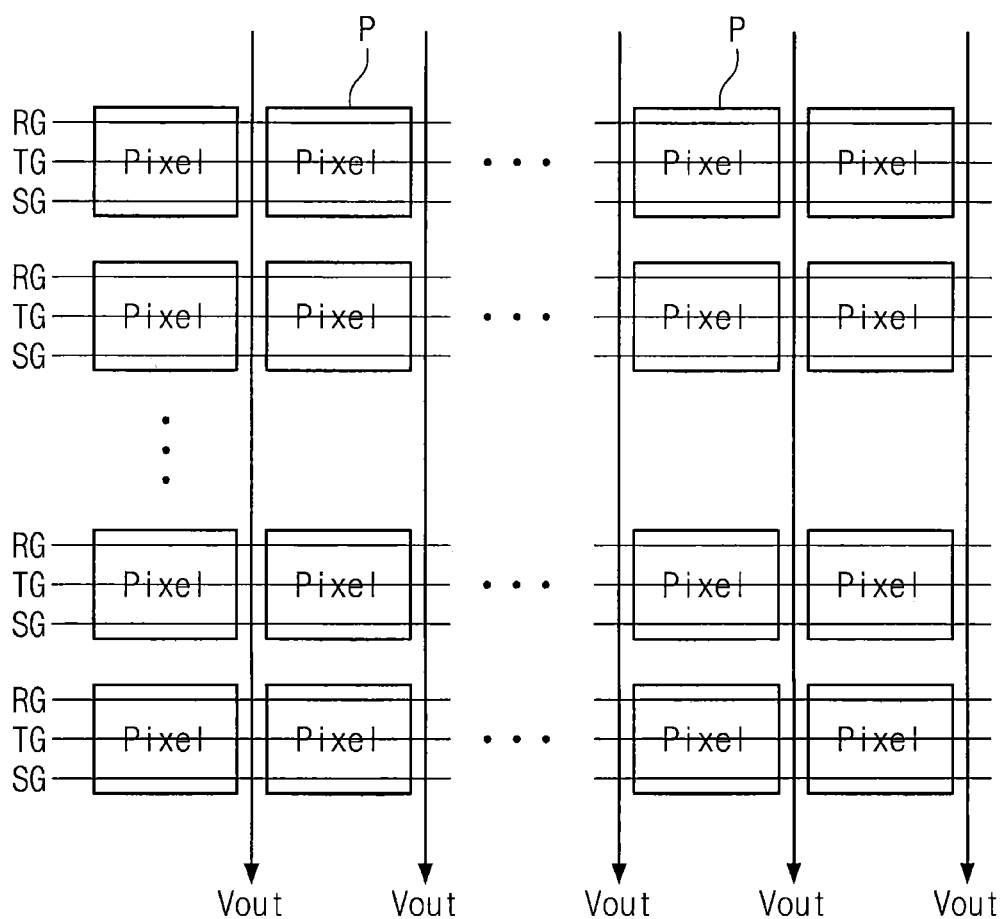
FIG. 2 is a circuit diagram schematically illustrating an active pixel sensor array of an image sensor according to some example embodiments of the inventive concepts.

FIG. 2 is a schematic circuit diagram illustrating an active pixel sensor array of an image sensor according to some example embodiments of the inventive concepts.

Referring to FIG. 2, the active pixel sensor array 1 may include a plurality of unit pixels P that are two-dimensionally arranged in rows and columns. Each of the unit pixels P may be configured to generate electrical signals from light incident thereto, and operations of the unit pixels P may be controlled by driving signals applied to the unit pixels P through pixel selection lines SG, charge transfer lines TG, and reset lines RG. The electrical signals generated in the unit pixels P may signal processing circuits (not shown) through output lines Vout.

Figure 3:
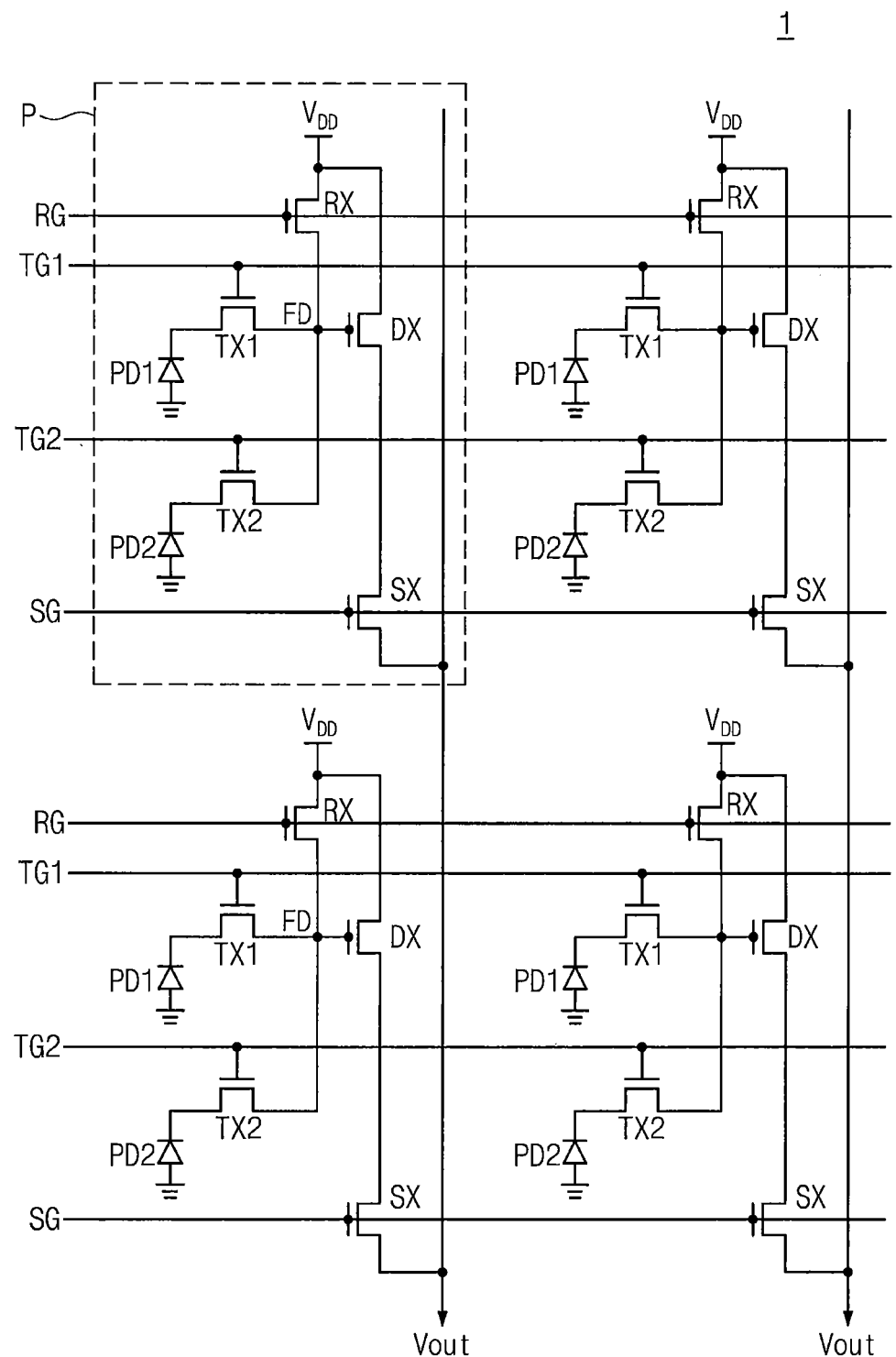
FIG. 3 is a circuit diagram illustrating an example of an active pixel sensor array of an image sensor according to some example embodiments of the inventive concepts.

FIG. 3 is a circuit diagram of an active pixel sensor array of an image sensor according to some example embodiments of the inventive concepts.

Referring to FIG. 3, the active pixel sensor array 1 may include a plurality of unit pixels P which are arranged in row and column directions to form a matrix shaped arrangement. The unit pixel P may include first and second photoelectric conversion devices PD1 and PD2, transfer transistors TX1 and TX2, and logic transistors RX, SX, and DX. The logic transistors may include a reset transistor RX, a selection transistor SX, and a drive or source-follower transistor DX. Gate electrodes of the first and second transfer transistors TX1 and TX2, the reset transistor RX, and the selection transistor SX may be respectively connected to lines (e.g., TG1, TG2, RG, SG) for transmitting driving signals.

The first transfer transistor TX1 may include a first transfer gate TG1 and a first photoelectric conversion device PD1, and the second transfer transistor TX2 may include a second transfer gate TG2 and a second photoelectric conversion device PD2. The first and second transfer transistors TX1 and TX2 may share a charge detection node FD (e.g., a floating diffusion region).

The first and second photoelectric conversion devices PD1 and PD2 may be configured to allow photocharges to be generated in proportion to an amount of external incident light and then to be accumulated therein. Each of the first and second photoelectric conversion devices PD1 and PD2 may be provided in a form of a photo diode, a photo transistor, a photo gate, a pinned photo diode (PPD), or any combination thereof.

The first and second transfer gates TG1 and TG2 may control an operation of transferring charges accumulated in the first and second photoelectric conversion devices PD1 and PD2 to the charge detection node FD (e.g., the floating diffusion region). Complementary signals may be applied to the first and second transfer gates TG1 and TG2, i.e., the first and second transfer gates TG1 and TG2 may be operated to allow the photocharges to be selectively transferred from one of the first and second photoelectric conversion devices PD1 and PD2 to the charge detection node FD.

The photocharges transferred from the first and second photoelectric conversion devices PD1 and PD2 may be cumulatively stored in the charge detection node FD. The drive transistor DX may be controlled, depending on an amount of the photocharges stored in the charge detection node FD.

The reset transistor RX may be configured to periodically discharge the photocharges stored in the charge detection node FD. The reset transistor RX may include drain and source electrodes, which are respectively connected to the charge detection node FD and a node applied with a power voltage VDD. If the reset transistor RX is turned on, the power voltage VDD may be applied to the charge detection node FD through the source electrode of the reset transistor RX. Accordingly, the photocharges stored in the charge detection node FD may be discharged to the power voltage VDD through the reset transistor RX.

The drive transistor DX, in conjunction with an electrostatic current source (not shown) outside the active pixel sensor array 1, may serve as a source follower buffer amplifier. In other words, the drive transistor DX may be used to amplify a variation in electric potential of the charge detection node FD and output the amplified signal to an output line Vout.

The selection transistor SX may be used to select a row of the unit pixels P to be read. If the selection transistor SX is turned on, the power voltage VDD may be applied to a drain electrode of the selection transistor SX through the drive transistor DX.

FIGS. 4A to 4D are plan views illustrating some examples of a color filter array of an image sensor according to some example embodiments of the inventive concepts.

Referring to FIG. 4A, in some embodiments, the active pixel sensor array 1 may include color filters respectively corresponding to the unit pixels. Each of the unit pixels may include one of red, green, and blue filters R, G, and B. In other words, the unit pixels may include red pixels including the red filters R, blue pixels including the blue filters B, and green pixels including the green filters G. The red filter R of the red pixel may be configured to allow red light to pass therethrough, and in this case, photoelectrons corresponding to the red light may be generated in the photoelectric conversion device of the red pixel. The blue filter B of the blue pixel may be configured to allow blue light to pass therethrough, and in this case, photoelectrons corresponding to the blue light may be generated in the photoelectric conversion device of the blue pixel. The green filter G of the green pixel may be configured to allow green light to pass therethrough, and in this case, photoelectrons corresponding to the green light may be generated in the photoelectric conversion device of the green pixel. In certain embodiments, the unit pixels of the active pixel sensor array 1 may be configured to include magenta (Mg), yellow (Y), and cyan (Cy) filters.

As an example, the color filters R, G, and B may be arranged to form a Bayer pattern, in which the number of the green filters G is two times the number of the red filters R or the blue filters B. For example, the Bayer pattern may include a color filter group including four color filters arranged in a 2×2 configuration, and the color filter group may include two green filters G arranged in one diagonal direction and blue and red filters R and B arranged in other diagonal direction. That is, in each of the color filter groups, each of the red and blue filters R and B may be disposed between a pair of the green filters G. The color filter groups of the Bayer pattern may be repeatedly arranged in first and second directions D1 and D2 that are not parallel to each other.

Referring to FIG. 4B, in some embodiments, each of the unit pixels of the active pixel sensor array 1 may include one of red, green, blue, and white filters R, G, B, and W. In some example embodiments, the white filter W may be a transparent color filter, allowing light in visible wavelength range to pass therethrough. The red, green, blue, and white filters R, G, B, and W may include a plurality of color filter groups, which are repeatedly arranged in the first and second directions D1 and D2, and each of which include four color filters arranged in a 2×2 configuration.

Referring to FIG. 4C, in further embodiments, the active pixel sensor array 1 may include color pixels and depth pixels. Each of the color pixels may include one of the red, green, and blue filters R, G, and B. Each of the depth pixels may include an infrared filter Z, allowing infrared light to pass therethrough.

The red, green, and blue filters R, G, and B and the infrared filter Z may include a plurality of filter groups, which are repeatedly arranged in the first and second directions D1 and D2, and each of which include four filters arranged in a 2×2 configuration. In some example embodiments, the infrared filter Z may be disposed between an adjacent pair of the color filters R, G, and B. The filters R, G, B, and Z may have substantially the same area.

In each filter group, the color and infrared filters R, G, B, and Z may be configured to allow light with different wavelengths to pass therethrough. As described above, the color pixels may be configured to generate photoelectrons from visible light. The infrared filter Z of the depth pixel may be configured to allow infrared light to pass therethrough, and the photoelectric conversion device of the depth pixel may be configured to generate photoelectrons from the infrared light. The use of the depth pixels sensing the infrared light may make it possible to calculate a distance from the imaging device to a subject and thereby to obtain three-dimensional images of the subject.

Referring to FIG. 4D, in still further embodiments, the active pixel sensor array 1 may include color pixels, each of which includes one of red, green, and blue filters R, G, and B, and depth pixels, each of which includes the infrared filter Z. The color pixels may be arranged in the first direction D1 and the second direction D2 to enclose the depth pixel. The infrared filter Z may have an area larger than that of each of the color filters R, G, and B.

Figure 5A:
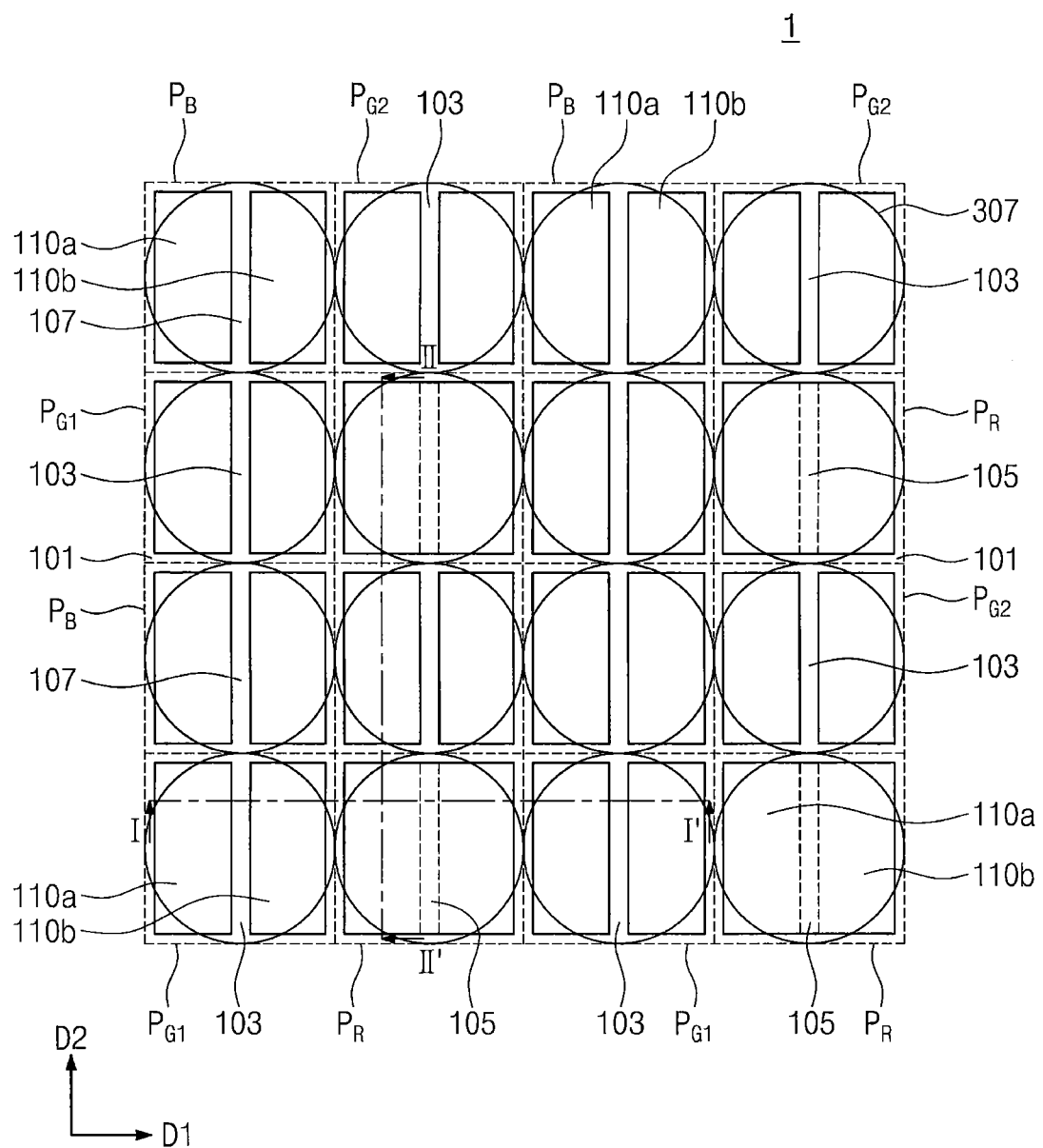
FIGS. 5A and 5B are plan views illustrating image sensors according to some example embodiments of the inventive concepts.
Figure 5B:
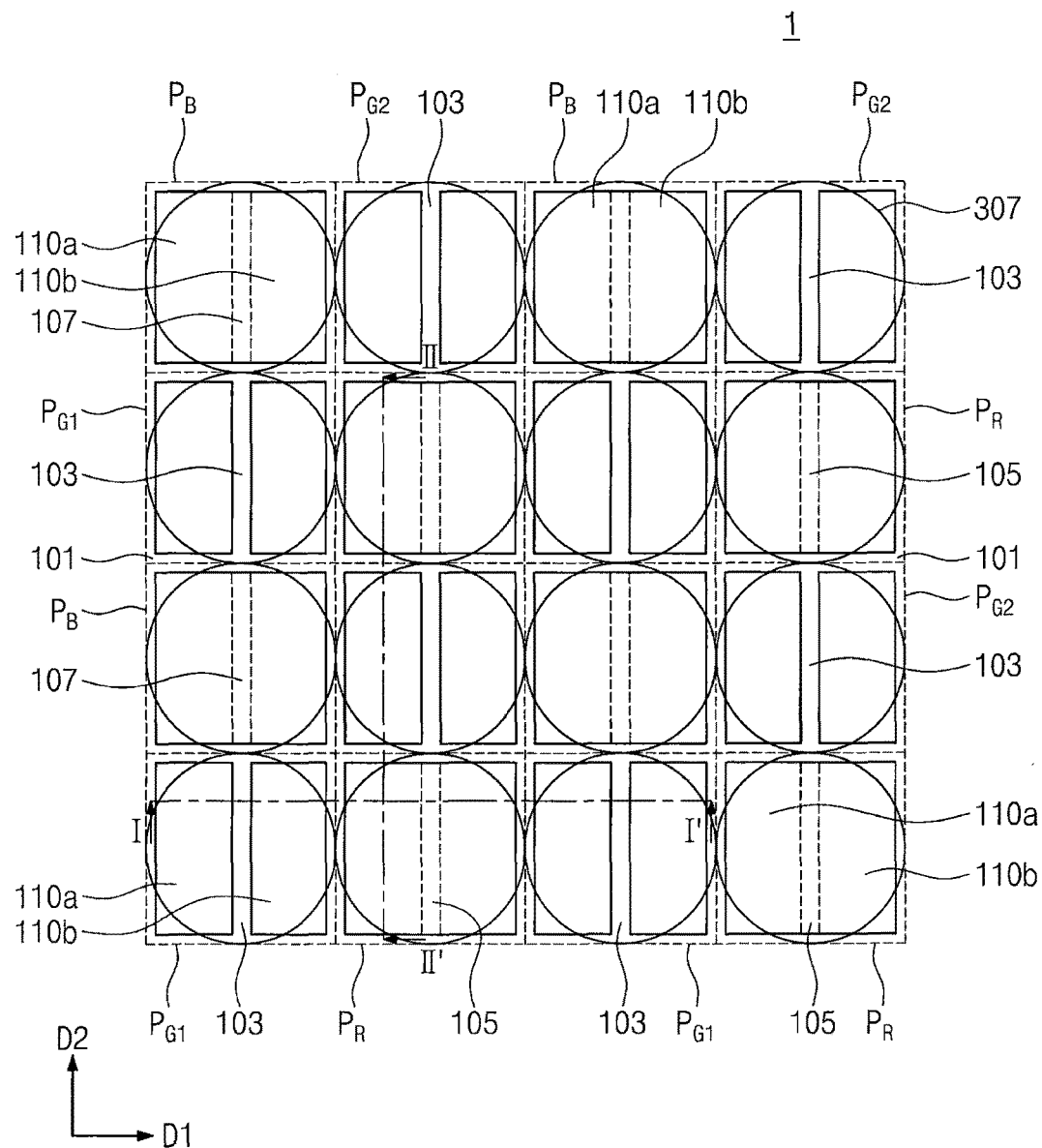
Figure 5C:
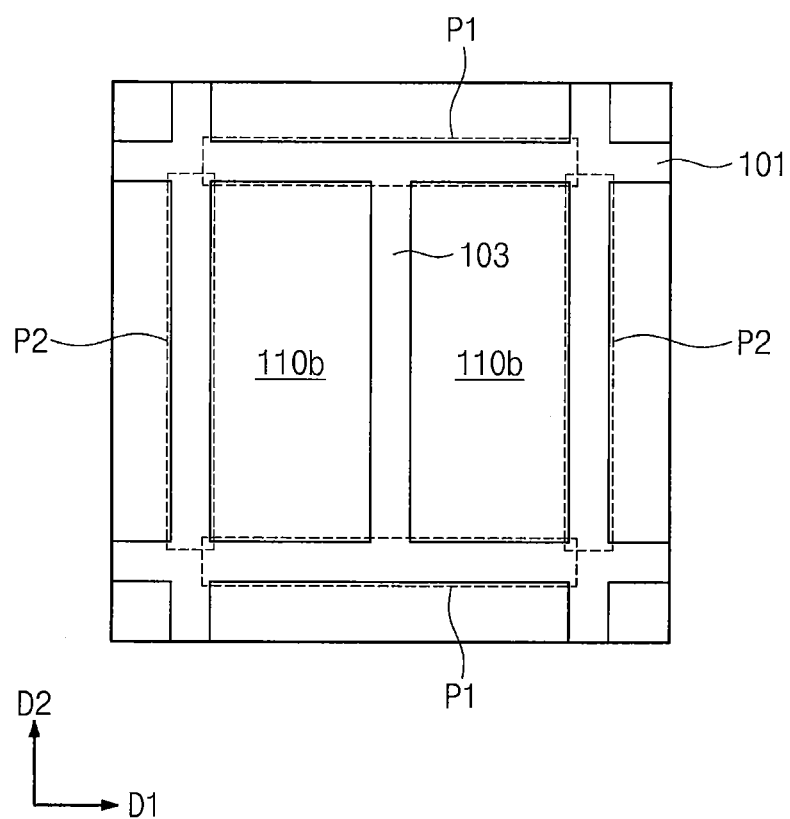
FIG. 5C is a diagram illustrating a portion of an image sensor according to some example embodiments of the inventive concepts.
Figure 6B:
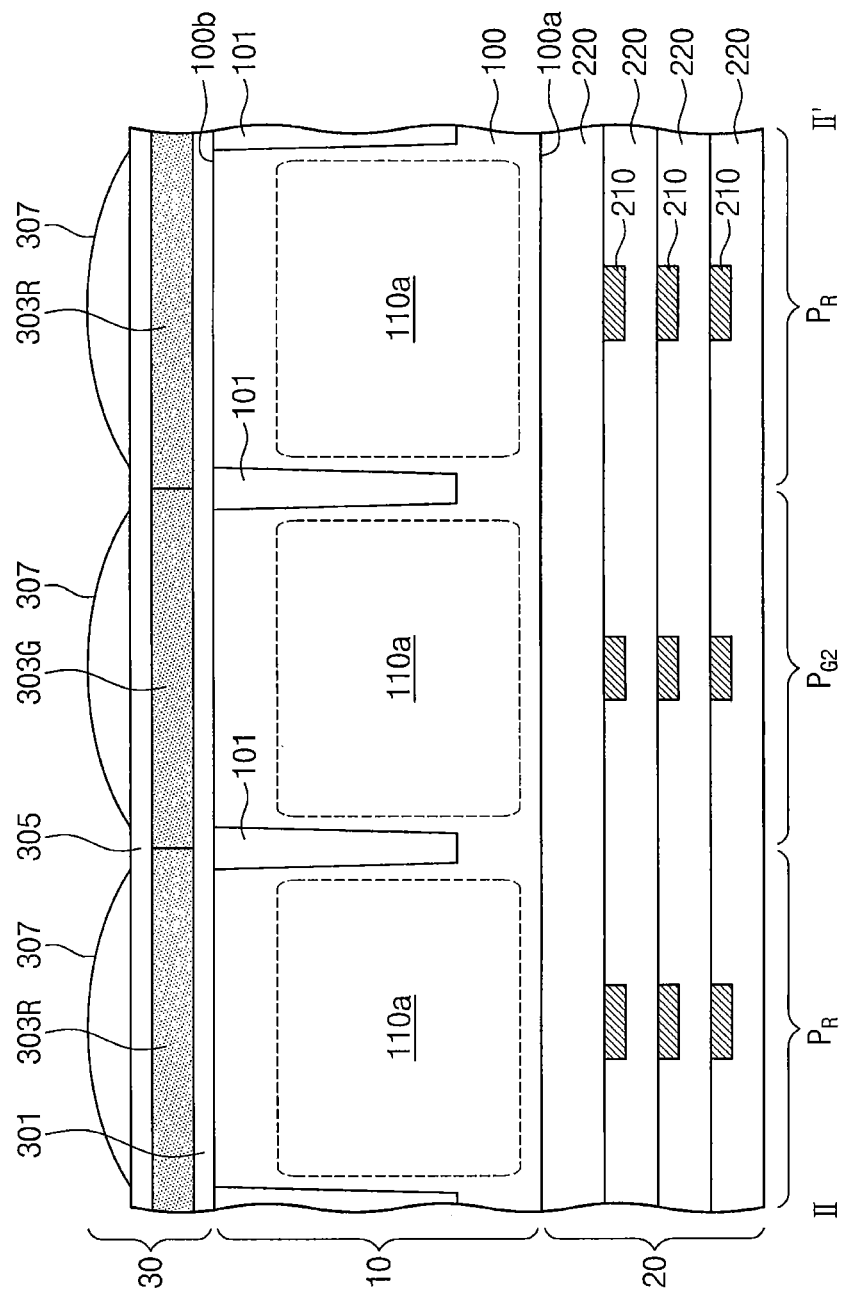

FIGS. 5A and 5B are plan views illustrating image sensors according to some example embodiments of the inventive concepts, and FIG. 5C is a diagram illustrating a portion of an image sensor according to some example embodiments of the inventive concepts. FIGS. 6A and 6B are sectional views, which are taken along lines I-I' and II-II', respectively, of FIG. 5A or 5B and illustrate image sensors according to some example embodiments of the inventive concepts.

Referring to FIGS. 5A, 5B, 6A, and 6B, an image sensor according to some example embodiments of the inventive concepts may include a photoelectric conversion layer 10, an interconnection structure 20, and an optically-transparent layer 30, and when viewed in a vertical sectional view, the photoelectric conversion layer 10 may be disposed between the interconnection structure 20 and the optically-transparent layer 30. In some example embodiments, a semiconductor substrate 100 may include a first or front surface 100a and a second or rear surface 100b on opposite sides thereof. The interconnection structure 20 may be disposed on the first surface 100a of the semiconductor substrate 100, and the optically-transparent layer 30 may be disposed on the second surface 100b of the semiconductor substrate 100.

The photoelectric conversion layer 10 may include the semiconductor substrate 100 and first and second photoelectric conversion regions 110a and 110b, which are provided in the semiconductor substrate 100. The first and second photoelectric conversion regions 110a and 110b may be configured to convert external incident light to electrical signals. The interconnection structure 20 may include logic transistors (e.g., TX1, TX2, RX, DX, and SX of FIG. 3), which are electrically connected to the first and second photoelectric conversion regions 110a and 110b, and interconnection lines, which are connected to the logic transistors. The electrical signals converted in the first and second photoelectric conversion regions 110a and 110b may be transmitted to other circuitry (e.g., one of the logic transistors) through the interconnection structure 20. The interconnection structure 20 may include interlayered insulating layers 220, which are stacked on the photoelectric conversion layer 10, and interconnection lines 210, which are interposed between the interlayered insulating layers 220, and in some example embodiments, the arrangement of the interconnection lines 210 may be independent of the arrangement of the first and second photoelectric conversion regions 110a and 110b. For example, the interconnection lines 210 may be arranged to cross over the first and second photoelectric conversion regions 110a and 110b. The optically-transparent layer 30 may include color filters 303G, 303R, and 303B and micro lenses 307. The optically-transparent layer 30 may be configured to allow external incident light to be focused on the photoelectric conversion layer 10.

In some example embodiments, the semiconductor substrate 100 may be formed from a bulk silicon wafer of a first conductivity type (e.g., p-type), on which an epitaxial layer of the first conductivity type is formed. In certain embodiments, the bulk silicon substrate may be removed during a process of fabricating the image sensor, and in this case, the p-type epitaxial layer may be used as the semiconductor substrate 100. In certain embodiments, the semiconductor substrate 100 may include a bulk semiconductor wafer, in which a well of the first conductivity type is formed. Various kinds of substrates (e.g., an n-type epitaxial layer, a bulk silicon wafer, and an SOI wafer) may be used as the semiconductor substrate 100.

In some example embodiments, the semiconductor substrate 100 may include a plurality of unit pixel regions $P_{G1}$, $P_{G2}$, $P_R$, and $P_B$, which are defined by a device separation layer 101. The unit pixel regions $P_{G1}$, $P_{G2}$, $P_R$, and $P_B$ may be arranged in the first and second directions D1 and D2 crossing each other to form a matrix-shaped arrangement. As an example, the unit pixel regions may include the first to third pixel regions $P_{G1}$, $P_{G2}$, $P_R$, and $P_B$, each of which is configured to receive light in a specific wavelength range. For example, the first pixel regions $P_{G1}$ and $P_{G2}$ may be configured to selectively receive light with a wavelength within a first wavelength range, and the second pixel regions $P_R$ may be configured to selectively receive light with wavelength within a second wavelength range longer than the first wavelength range. The third pixel regions $P_B$ may be configured to selectively receive light with a wavelength within a third wavelength range shorter than the first wavelength range. For example, the unit pixel regions $P_{G1}$, $P_{G2}$, $P_R$, and $P_B$ may be configured in such a way that green light is incident into the first pixel regions $P_{G1}$ and $P_{G2}$, red light is incident into the second pixel regions $P_R$, and blue light is incident into the third pixel regions $P_B$.

In some example embodiments, the first pixel regions $P_{G1}$ and $P_{G2}$ may be arranged spaced apart from each other in the first and second directions D1 and D2. Each of the second pixel regions $P_R$ may be disposed between the first pixel regions $P_{G1}$ adjacent to each other in the first direction D1 and between the first pixel regions $P_{G2}$ adjacent to each other in the second direction D2. Each of the third pixel regions $P_B$ may be disposed between the first pixel regions $P_{G1}$ adjacent to each other in the first direction D1 and between the first pixel regions $P_{G1}$ adjacent to each other in the second direction D2 and may be disposed to be diagonal to the second pixel regions $P_R$.

In some example embodiments, the device separation layer 101 may be configured to reduce the likelihood of photocharges moving from one of the first to third pixel regions $P_{G1}$, $P_{G2}$, $P_R$, and $P_B$ to a neighboring pixel region through a random drift phenomenon. In other words, the device separation layer 101 may be configured to reduce a cross-talk phenomenon from occurring between the first to third pixel regions $P_{G1}$, $P_{G2}$, $P_R$, and $P_B$.

For example, when viewed in a plan view, the device separation layer 101 may enclose each of the first to third pixel regions $P_{G1}$, $P_{G2}$, $P_R$, and $P_B$. As an example, as shown in FIG. 5C, when viewed in a plan view, the device separation layer 101 may include first portions P1, which extend in the first direction D1 and are spaced apart from each other in the second direction D2, and second portions P2, which extend in the second direction D2 and are spaced apart from each other in the first direction D1. Each of the first to third pixel regions $P_{G1}$, $P_{G2}$, $P_R$, and $P_B$ may be defined by a pair of the first portions P1 and a pair of the second portions P2.

The device separation layer 101 may be formed of an insulating material having a refractive index lower than that of the semiconductor substrate 100 (e.g., of silicon), and may include one or more insulating layers. For example, the device separation layer 101 may be formed of or include at least one of a silicon oxide layer, a silicon nitride layer, an undoped poly-silicon layer, air, or combinations thereof. The formation of the device separation layer 101 may include removing portions of the first surface 100a and/or the second surface 100b of the semiconductor substrate 100 to form a deep trench and filling the deep trench with an insulating material.

The device separation layer 101 may extend vertically from the second surface 100b toward the first surface 100a of the semiconductor substrate 100 and may be spaced apart from the first surface 100a of the semiconductor substrate 100. In other words, a vertical thickness of the device separation layer 101 may be smaller than that of the semiconductor substrate 100. In certain embodiments, the device separation layer 101 may pass through the semiconductor substrate 100. In other words, the vertical thickness of the device separation layer 101 may be substantially the same as the vertical thickness of the semiconductor substrate 100. Alternatively, the device separation layer 101 may extend vertically from the first surface 100a toward the second surface 100b of the semiconductor substrate 100 but not through the semiconductor substrate 100, and may be spaced apart from the second surface 100b of the semiconductor substrate 100.

In some example embodiments, a portion of the device separation layer 101 adjacent to the first surface 100a of the semiconductor substrate 100 may have a first width, and portion adjacent to the second surface 100b of the semiconductor substrate 100 may have a second width greater than the first width. For example, the width of the device separation layer 101 may gradually decrease in a direction from the second surface 100b toward the first surface 100a of the semiconductor substrate 100. In certain embodiments, the device separation layer 101 may be provided in such a way that the second width is smaller than the first width. For example, the width of the device separation layer 101 may gradually decrease in a direction from the first surface 100a toward the second surface 100b of the semiconductor substrate 100.

In some example embodiments, the first and second photoelectric conversion regions 110a and 110b may be provided in each of the first to third pixel regions $P_{G1}$, $P_{G2}$, $P_R$, and $P_B$. In other words, a pair of the first and second photoelectric conversion regions 110a and 110b may be provided in each of the pixel regions $P_{G1}$, $P_{G2}$, $P_R$, and $P_B$. The first and second photoelectric conversion regions 110a and 110b may be impurity regions that are doped with impurities and may have a second conductivity type (e.g., n-type) different from that of the semiconductor substrate 100. In some example embodiments, the first and second photoelectric conversion regions 110a and 110b may be adjacent to the first surface 100a of the semiconductor substrate 100 and may be spaced apart from the second surface 100b. For example, the first and second photoelectric conversion regions 110a and 110b may be formed by injecting impurities of the second conductivity type (e.g., n-type) into the first surface 100a of the semiconductor substrate 100. The first and second photoelectric conversion regions 110a and 110b may have a difference in doping concentration between regions adjacent to the first and second surfaces 100a and 100b, and thus, the semiconductor substrate 100 may have a potential difference between the first surface 100a and the second surface 100b.

In some example embodiments, the semiconductor substrate 100 of the first conductivity type and the first and second photoelectric conversion regions 110a and 110b may form pairs of photodiodes. In other words, a junction serving as a photodiode may be formed between the semiconductor substrate 100 of the first conductivity type and the first or second photoelectric conversion regions 110a or 110b. In the case where light is incident into the first and second photoelectric conversion regions 110a and 110b of the photodiodes, photocharges may be generated and stored in proportion to an intensity of the incident light. Furthermore, the photodiode may further include a p-type impurity region (not shown), which is doped with p-type impurities and is shallowly formed near the surfaces of the first and second photoelectric conversion regions 110a and 110b.

In some example embodiments, in each of the first to third pixel regions $P_{G1}$, $P_{G2}$, $P_R$, and $P_B$, there may be a difference in phase between electrical signals output from the first and second photoelectric conversion regions 110a and 110b. The image sensor may be configured to analyze the difference in phase between the electrical signals to be output from the pair of the first and second photoelectric conversion regions 110a and 110b and to adjust a focal point of the imaging device based on the analysis.

In some example embodiments, a first isolation structure 103 may be provided in each of the first pixel regions $P_{G1}$ and $P_{G2}$ and between the first and second photoelectric conversion regions 110a and 110b. When viewed in a plan view, the first isolation structure 103 may have a line-shaped structure extending along the second direction D2. In the semiconductor substrate 100, the first isolation structure 103 may be connected to the device separation layer 101. For example, as shown in FIG. 5C, the first isolation structure 103 may be connected to a portion (e.g., the first portions P1) of the device separation layer 101 extending along the first direction D1.

When viewed in a vertical sectional view, the first isolation structure 103 may extend vertically from the second surface 100b toward the first surface 100a of the semiconductor substrate 100. The first isolation structure 103 may have substantially the same vertical thickness as that of the device separation layer 101. In other words, a distance d2 from the second surface 100b of the semiconductor substrate 100 to the bottom surface of the first isolation structure 103 may be substantially equal to a distance d1 from the second surface 100b of the semiconductor substrate 100 to the bottom surface of the device separation layer 101.

In each of the first pixel regions $P_{G1}$ and $P_{G2}$, the first and second photoelectric conversion regions 110a and 110b may be spaced apart from each other by the first isolation structure 103. That is, in each of the first pixel regions $P_{G1}$ and $P_{G2}$, the first isolation structure 103 and the device separation layer 101 may enclose each of the first and second photoelectric conversion regions 110a and 110b. In addition, the first and second photoelectric conversion regions 110a and 110b of the first pixel regions $P_{G1}$ and $P_{G2}$ may be in contact with sidewalls of the device separation layer 101 and the first isolation structure 103.

In some example embodiments, the formation of the first isolation structure 103 may include patterning the second surface 100b of the semiconductor substrate 100 to form a deep trench in the semiconductor substrate 100 and filling the deep trench with an insulating material. A width of the first isolation structure 103 may gradually decrease in a direction from the second surface 100b toward the first surface 100a of the semiconductor substrate 100, and the first isolation structure 103 may be spaced apart from the first surface 100a of the semiconductor substrate 100. In certain embodiments, the first isolation structure 103 may be formed by patterning the first surface 100a of the semiconductor substrate 100, and in this case, the first isolation structure 103 may be spaced apart from the second surface 100b of the semiconductor substrate 100.

As an example, the first isolation structure 103 may be formed at the same time when the device separation layer 101 is formed, and thus, the first isolation structure 103 may include the same insulating material as the device separation layer 101. The first isolation structure 103 may be formed of an insulating material with a refractive index lower than the semiconductor substrate 100. For example, the first isolation structure 103 may be formed of or include at least one of a silicon oxide layer, a silicon nitride layer, an undoped poly-silicon layer, air, or any combination thereof. In each of the first pixel regions $P_{G1}$ and $P_{G2}$, the first isolation structure 103 may make it possible to reduce or prevent a cross-talk phenomenon from occurring between the first and second photoelectric conversion regions 110a and 110b and thereby to detect a phase difference between electrical signals generated from the first pixel regions $P_{G1}$ and $P_{G2}$. In other words, it is possible to improve auto-focusing characteristics at the first pixel regions $P_{G1}$ and $P_{G2}$.

In some example embodiments, a second isolation structure 105 may be provided in each of the second pixel regions $P_R$ and between the first and second photoelectric conversion regions 110a and 110b. The second pixel region $P_R$ with the second isolation structure 105 may be configured to receive light having wavelength longer than that of light incident into the first pixel regions $P_{G1}$ and $P_{G2}$. In some example embodiments, the second isolation structure 105 may be formed of a material having a refractive index different from that of the first isolation structure 103, or may be formed to have a shape different from the first isolation structure 103. This difference may make it possible to suppress long-wavelength light incident into the second pixel regions $P_R$ from being irregularly reflected by the second isolation structure 105 and thereby reduce a cross-talk phenomenon between the second pixel regions $P_R$ and the first pixel regions $P_{G1}$ and $P_{G2}$ adjacent thereto.

In detail, when viewed in a plan view, the second isolation structure 105 may have a line-shaped structure extending along the second direction D2 and may be in contact with the device separation layer 101. Also, when viewed in a vertical sectional view, the second isolation structure 105 may extend vertically from the second surface 100b toward the first surface 100a of the semiconductor substrate 100. In each of the second pixel regions $P_R$, the second isolation structure 105 and the device separation layer 101 may enclose the first photoelectric conversion region 110a, and the second isolation structure 105 and the device separation layer 101 may enclose the second photoelectric conversion region 110b.

In some example embodiments, the second isolation structure 105 may be a doped region formed in the semiconductor substrate 100 and having a first conductivity type, and may be formed by injecting impurities of the first conductivity type into the second pixel regions $P_R$ of the semiconductor substrate 100. For example, the second isolation structure 105 may be formed by injecting impurities of the first conductivity type into the second surface 100b of the semiconductor substrate 100 and may be formed spaced apart from the first surface 100a of the semiconductor substrate 100. In some example embodiments, a distance d3 from the second surface 100b of the semiconductor substrate 100 to the bottom surface of the second isolation structure 105 may be substantially equal to a distance d1 from the second surface 100b of the semiconductor substrate 100 to the bottom surface of the device separation layer 101.

In some example embodiments, since the second isolation structure 105 includes the impurity region of the first conductivity type, a potential barrier may be produced between the first and second photoelectric conversion regions 110a and 110b to impede photocharges from moving from the first photoelectric conversion region 110a to the second photoelectric conversion region 110b or from the second photoelectric conversion region 110b to the first photoelectric conversion region 110a. In addition, like the first and second photoelectric conversion regions 110a and 110b, the second isolation structure 105 may be formed of a semiconductor material, and in this case, it is possible to suppress a cross-talk phenomenon, in which light incident into the second pixel regions $P_R$ is refracted or reflected by the second isolation structure 105 extending along the second direction D2 and is incident into the first pixel regions $P_{G1}$ and $P_{G2}$ adjacent to each other in the first direction D1. For example, it is possible to allow the cross-talk phenomenon between the second pixel regions $P_R$ and the first pixel regions $P_{G1}$ and $P_{G2}$ adjacent thereto to occur in substantially the same manner between the first and second directions D1 and D2. In other words, although the cross-talk phenomenon occurs in the first pixel regions $P_{G1}$ adjacent to the second pixel regions $P_R$ in the first direction D1 and in the first pixel regions $P_{G2}$ adjacent to the second pixel regions $P_R$ in the second direction D2, it is possible to reduce a directional difference of the cross-talk phenomenon. Accordingly, it is possible to suppress or prevent a noise level from being changed by a positional difference between the first pixel regions $P_{G1}$ and $P_{G2}$.

In some example embodiments, a third isolation structure 107 may be provided in each of the third pixel regions $P_B$ and between the first and second photoelectric conversion regions 110a and 110b. The third pixel region $P_B$ with the third isolation structure 107 may be configured to receive light having a wavelength shorter than that of light to be incident into the first pixel regions $P_{G1}$ and $P_{G2}$.

As an example, when viewed in a plan view, the third isolation structure 107 may have a line-shaped structure extending along the second direction D2 and may be connected to the device separation layer 101. Furthermore, when viewed in a vertical sectional view, the third isolation structure 107 may extend vertically from the second surface 100b toward the first surface 100a of the semiconductor substrate 100.

In each of the third pixel regions $P_B$, the first isolation structure 107 and the device separation layer 101 may enclose each of the first photoelectric conversion region 110a and the second photoelectric conversion region 110b. For example, the first and second photoelectric conversion regions 110d and 110b of the third pixel regions $P_B$ may be in contact with sidewalls of the device separation layer 101 and the third isolation structure 107.

In some example embodiments, the formation of the third isolation structure 107 may include patterning the second surface 100b of the semiconductor substrate 100 to form a deep trench in the semiconductor substrate 100 and filling the deep trench with an insulating material. A width of the third isolation structure 107 may gradually decrease in a direction from the second surface 100b toward the first surface 100a of the semiconductor substrate 100, and the third isolation structure 107 may be spaced apart from the first surface 100a of the semiconductor substrate 100. In certain embodiments, the third isolation structure 107 may be formed by patterning the first surface 100a of the semiconductor substrate 100, and in this case, the third isolation structure 107 may be spaced apart from the second surface 100b of the semiconductor substrate 100.

As an example, the third isolation structure 107 may be formed at the same time when the device separation layer 101 is formed, and thus, the third isolation structure 107 and the device separation layer 101 may be substantially the same in terms of their structure and material. For example, the third isolation structure 107 may be formed of an insulating material having a refractive index lower than the semiconductor substrate 100. In addition, a vertical thickness of the third isolation structure 107 may be substantially equal to that of the device separation layer 101. In other words, a distance between the second surface 100b of the semiconductor substrate 100 and the bottom surface of the third isolation structure 107 may be substantially equal to a distance between the second surface 100b of the semiconductor substrate 100 and the bottom surface of the device separation layer 101.

Referring to FIG. 5B, the third isolation structure 107 and the second isolation structure 105 may be substantially the same in terms of their structure and material. For example, the third isolation structure 107 may be or include an impurity region, which is of the first conductivity type, is in contact with the device separation layer 101, and extends in the second direction D2 in a plan view. For example, the third isolation structure 107 may be formed by injecting impurities of the first conductivity type into the second surface 100b of the semiconductor substrate 100 and may be formed spaced apart from the first surface 100a of the semiconductor substrate 100.

According to some example embodiments of the inventive concepts, in each of the first to third pixel regions $P_{G1}$, $P_{G2}$, $P_R$, and $P_B$, a floating diffusion layer 120 may be provided between the first and second photoelectric conversion regions 110a and 110b. In each of the first to third pixel regions $P_{G1}$, $P_{G2}$, $P_R$, and $P_B$, the floating diffusion layer 120 may be formed by injecting impurities of the second conductivity type into the first surface 100a of the semiconductor substrate 100.

A first transfer gate electrode 201a and a second transfer gate electrode 201b may be provided on the first surface 100a of the semiconductor substrate 100. The first transfer gate electrode 201a may be provided between the first photoelectric conversion region 110a and the floating diffusion layer 120, and the second transfer gate electrode 201b may be provided between the second photoelectric conversion region 110b and the floating diffusion layer 120.

The interconnection lines 210 and contact plugs (not shown) may be provided on the first surface 100a of the semiconductor substrate 100 and may be connected to the logic transistors. In detail, the interconnection lines 210 may be stacked on the first surface 100a of the semiconductor substrate 100, and the interlayered insulating layers may be interposed between the interconnection lines 210 or between the interconnection lines 210 and the semiconductor substrate 100. The arrangement of the interconnection lines 210 may be independent of the arrangement of the first and second photoelectric conversion regions 110a and 110b. In other words, the interconnection lines 210 may cross over the first and second photoelectric conversion regions 110a and 110b.

The color filters 303G, 303R, and 303B and the micro lenses 307 may be provided on the second surface 100b of the semiconductor substrate 100. A first flattening layer 301 may be disposed between the second surface 100b of the semiconductor substrate 100 and the color filters 303G, 303R, and 303B, and a second flattening layer 305 may be disposed between the color filters 303G, 303R, and 303B and the micro lenses 307. Each of the color filters 303G, 303R, and 303B and each of the micro lenses 307 may be disposed on a corresponding one of the first to third pixel regions $P_{G1}$, $P_{G2}$, $P_R$, and $P_B$.

Each of the color filters 303G, 303R, and 303B may include one of red, green, and blue filters, as described with reference to FIGS. 4A to 4D. In certain embodiments, each of the color filters may include one of cyan, magenta, and yellow filters. In some example embodiments, the green filters 303G may be provided on the first pixel regions $P_{G1}$ and $P_{G2}$, the red filters 303R may be provided on the second pixel regions $P_R$, and the blue filters 303B may be provided on the third pixel regions $P_B$.

The micro lens 307 may have a convex shape, allowing incident light to be concentrated onto a corresponding one of the first to third pixel regions $P_{G1}$, $P_{G2}$, $P_R$, and $P_B$. In some example embodiments, when viewed in a plan view, respective ones of the micro lenses 307 may be overlapped with respective pairs of photoelectric conversion regions (e.g., the first and second photoelectric conversion regions 110a and 110b).

FIGS. 7A to 7F are sectional views taken along line I-I' of FIG. 5A to illustrate image sensors according to some example embodiments of the inventive concepts. For concise description, an element previously described with reference to FIGS. 5A, 5B, 6A, and 6B may be identified by a similar or identical reference number and repeated description thereof may be omitted.

Figure 7A:
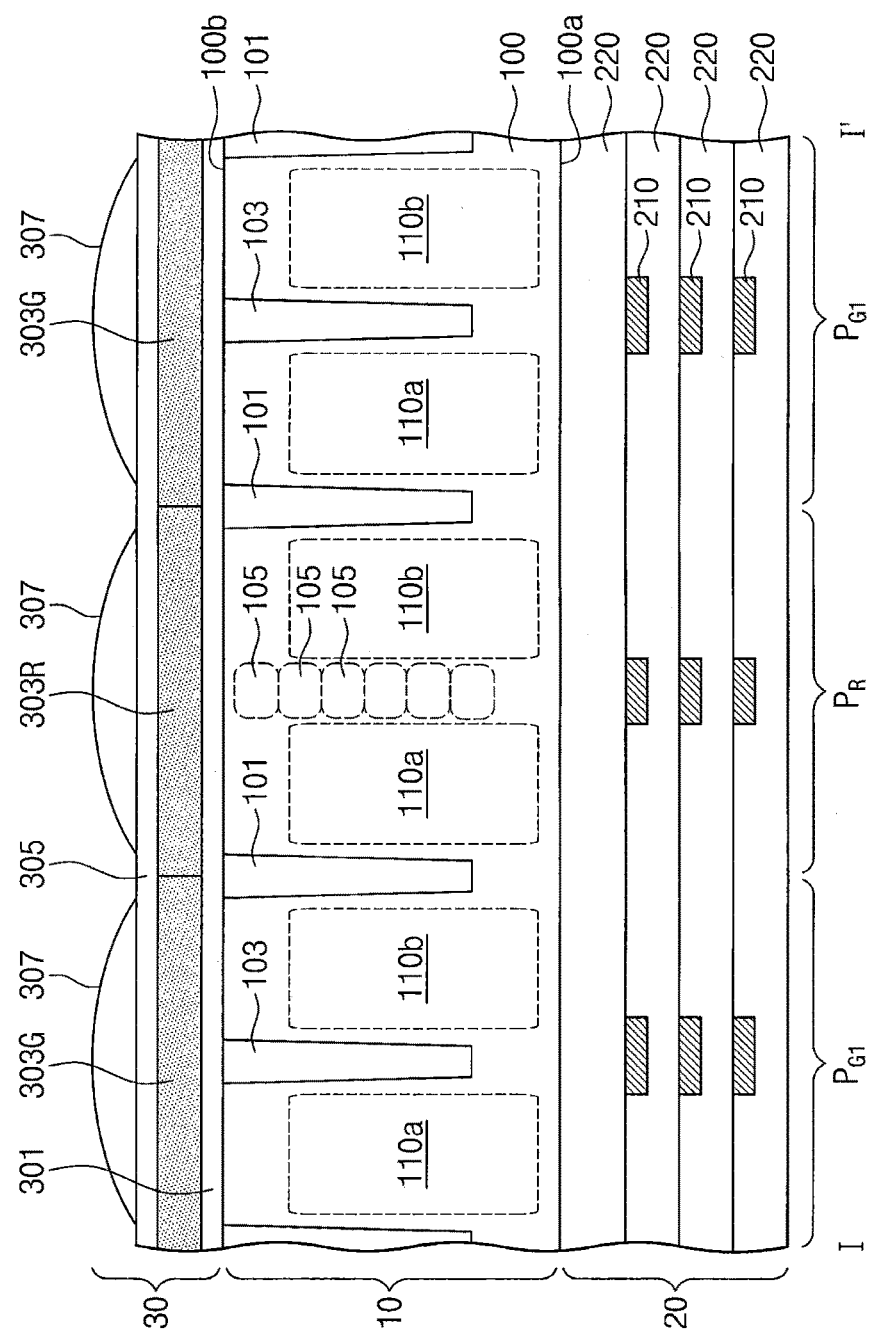

According to embodiments shown in FIG. 7A, in each of the second pixel regions $P_R$, the second isolation structure 105 may include a plurality of impurity regions 105 that are doped with impurities of the first conductivity type. The second isolation structure 105 may be formed by performing a plurality of ion implantation processes under different ion energy conditions, and in this case, it is possible to make a difference in an injection depth of the impurities or a vertical position of each impurity region. Furthermore, it is possible to make a difference in doping concentration of the impurity region 105 in a vertical direction normal to the second surface 100b of the semiconductor substrate 100.

Figure 7B:
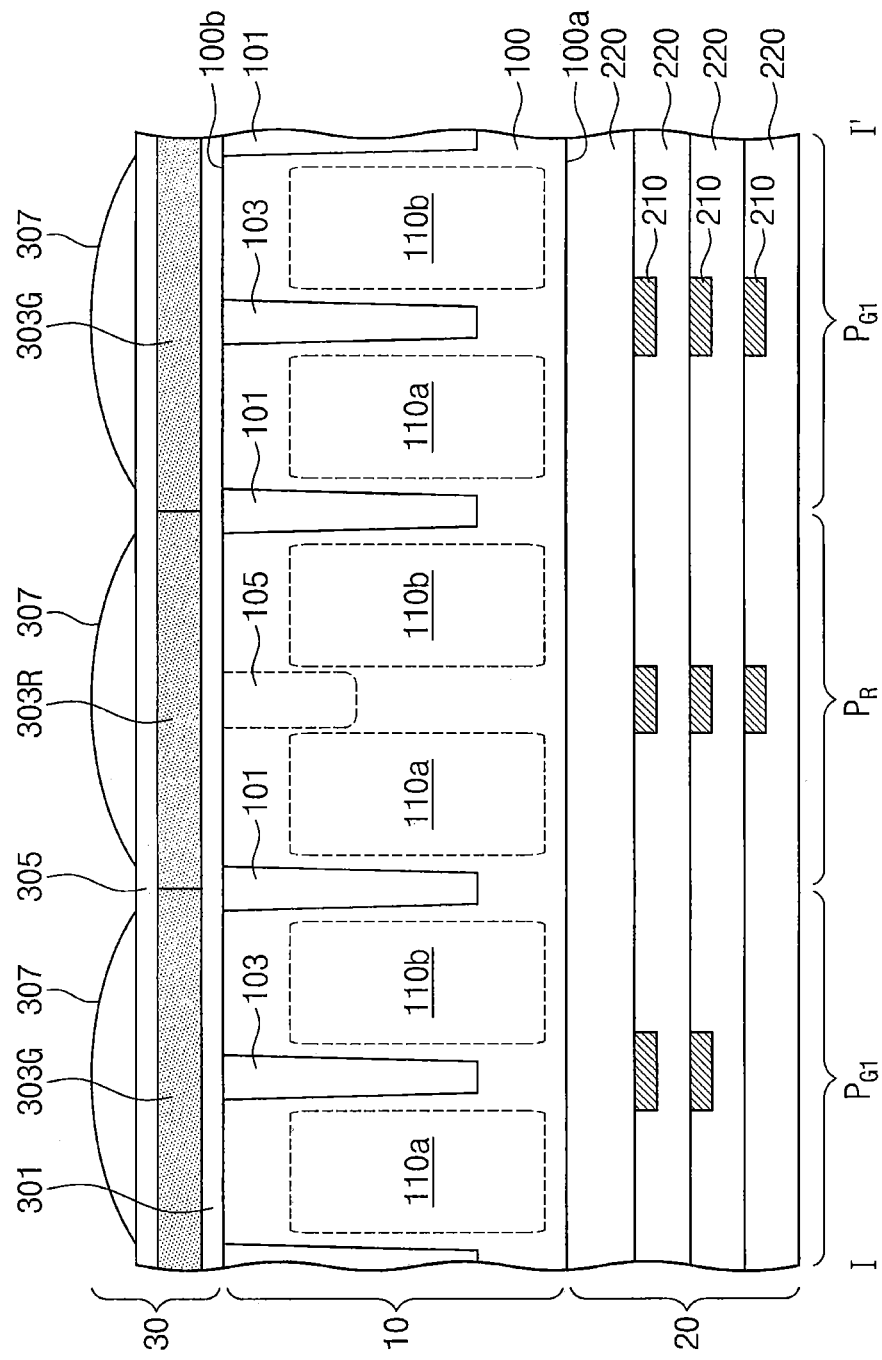

Referring to FIG. 7B, the second isolation structure 105 may be an impurity region of the first conductivity type and is formed adjacent to the second surface 100b of the semiconductor substrate 100. The vertical depth of the isolation structures 105 is less than that of the device separation layer 101. In other words, a distance from the second surface 100b to a bottom surface of the second isolation structure 105 may be less than a distance from the second surface 100b to the bottom surface of the device separation layer 101. In certain embodiments, the second isolation structure 105 may be an insulating pattern, whose vertical depth is less than that of the device separation layer 101.

Figure 7C:
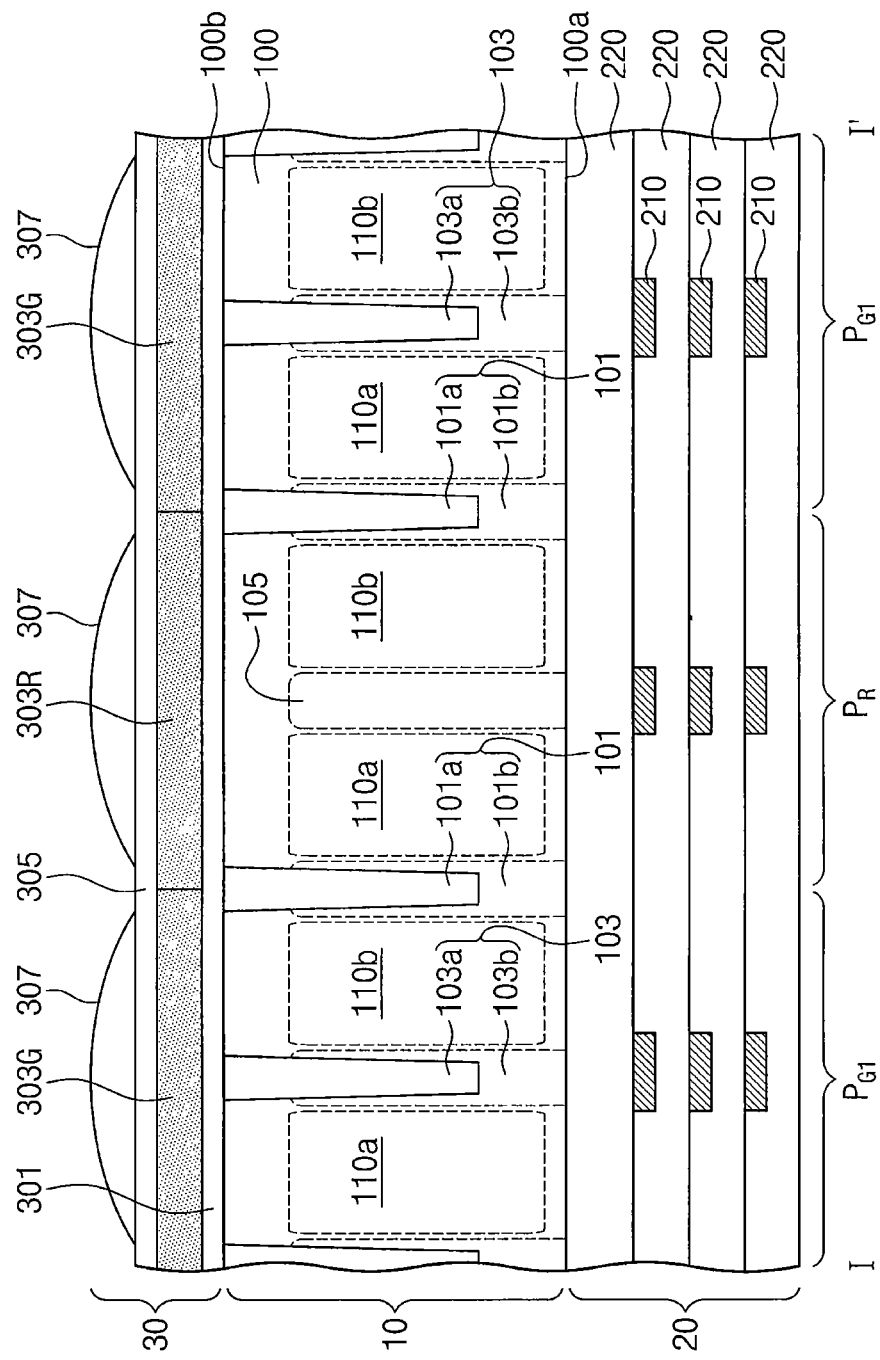
Figure 7D:
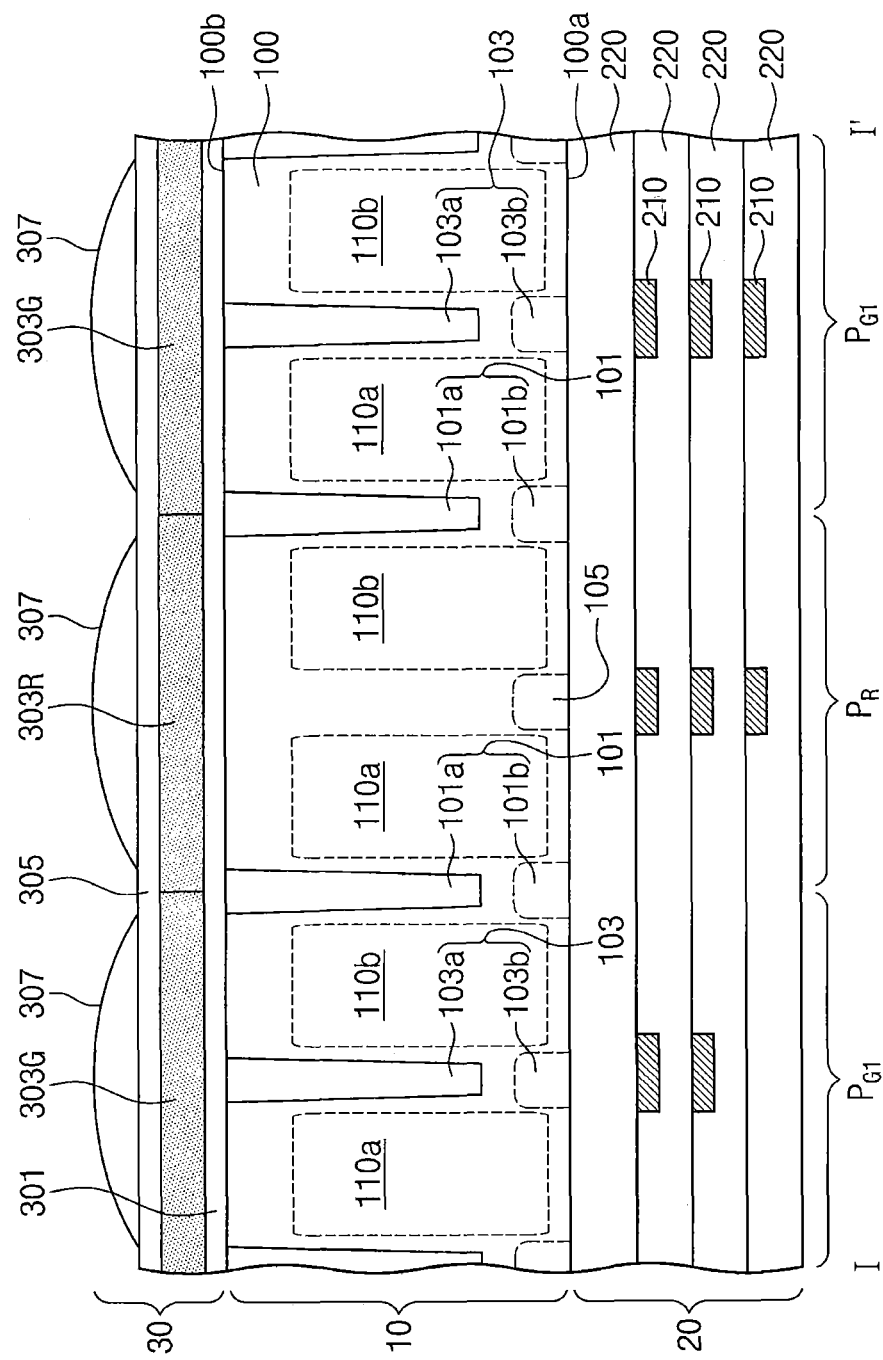

The device separation layer 101 may define the first to third pixel regions $P_{G1}$, $P_{G2}$, $P_R$, and $P_B$, and, according to embodiments shown in FIGS. 7C and 7D, the device separation layer 101 may include an insulating separation layer 101a and a doped separation layer 101b. The insulating separation layer 101a may extend from the second surface 100b of the semiconductor substrate 100 but may be spaced apart from the first surface 100a, and the doped separation layer 101b may extend from the first surface 100a of the semiconductor substrate 100 but may be spaced apart from the second surface 100b. The doped separation layer 101b may be formed by injecting impurities of the first conductivity type into the first surface 100a of the semiconductor substrate 100. As an example, the doped separation layer 101b may enclose a portion of the insulating separation layer 101a, as shown in FIG. 7C. In certain embodiments, the doped separation layer 101b may be spaced apart from the insulating separation layer 101a, as shown in FIG. 7C.

The first isolation structure 103 may include a first insulating isolation layer 103a and a first doped isolation layer 103b. The first doped isolation layer 103a may be an impurity region, which is doped with impurities of the first conductivity type. The first doped isolation layer 103b may enclose a portion of the first insulating isolation layer 103a, as shown in FIG. 7C. Alternatively, the first doped isolation layer 103b may be spaced apart from the first insulating isolation layers 103a, as shown in FIG. 7D.

As described with reference to FIG. 5A, when viewed in a plan view, the second isolation structure 105 may extend in the second direction D2 and may be an impurity region of the first conductivity type. The second isolation structure 105 may be formed by injecting impurities of the first conductivity type into the first surface 100a of the semiconductor substrate 100 and may be formed spaced apart from the second surface 100b of the semiconductor substrate 100.

As an example, the second isolation structure 105 may be formed concurrently with the doped separation layer 101b of the device separation layer 101 and the first and third doped isolation layers 103b of the first and third isolation structures 103 and 107. Accordingly, the second isolation structure 105 may have substantially the same vertical depth as the doped separation layer 101b and the first and third doped isolation layers 103b. The third isolation structure 107 may include a third insulating isolation layer and a third doped isolation layer, similar to the first isolation structure 103.

According to embodiments shown in FIG. 7E, the device separation layer 101 may include the insulating separation layer 101a and the doped separation layer 101b, which is of the first conductivity type and is formed to cover the surface of the insulating separation layer 101a. The doped separation layer 101b may be doped to have the first conductivity type (e.g., p-type). The doped separation layer 101b may be in direct contact with the semiconductor substrate 100 of the first conductivity type. The doped separation layer 101b may be formed in such a way that a doping concentration of the first conductivity type impurities therein is higher than that in the semiconductor substrate 100. Accordingly, the doped separation layer 101b may serve as a potential barrier formed around the first and second photoelectric conversion regions 110a and 110b. In detail, a patterning process may be performed to form a deep trench in the semiconductor substrate 100, but as a result of the pattering process, surface defects may be formed on a surface of the deep trench. In some example embodiments, the doped separation layer 101b serving the potential barrier may make it possible to reduce the dark current, which may be caused by the surface defects.

In some example embodiments, the first isolation structure 103 may include the first insulating isolation layer 103a and the first doped isolation layer 103b, which is formed to cover the surface of the first insulating isolation layer 103a, like the device separation layer 101. The third isolation structure 107 may have a structure similar to the first isolation structure 103.

Figure 7F:
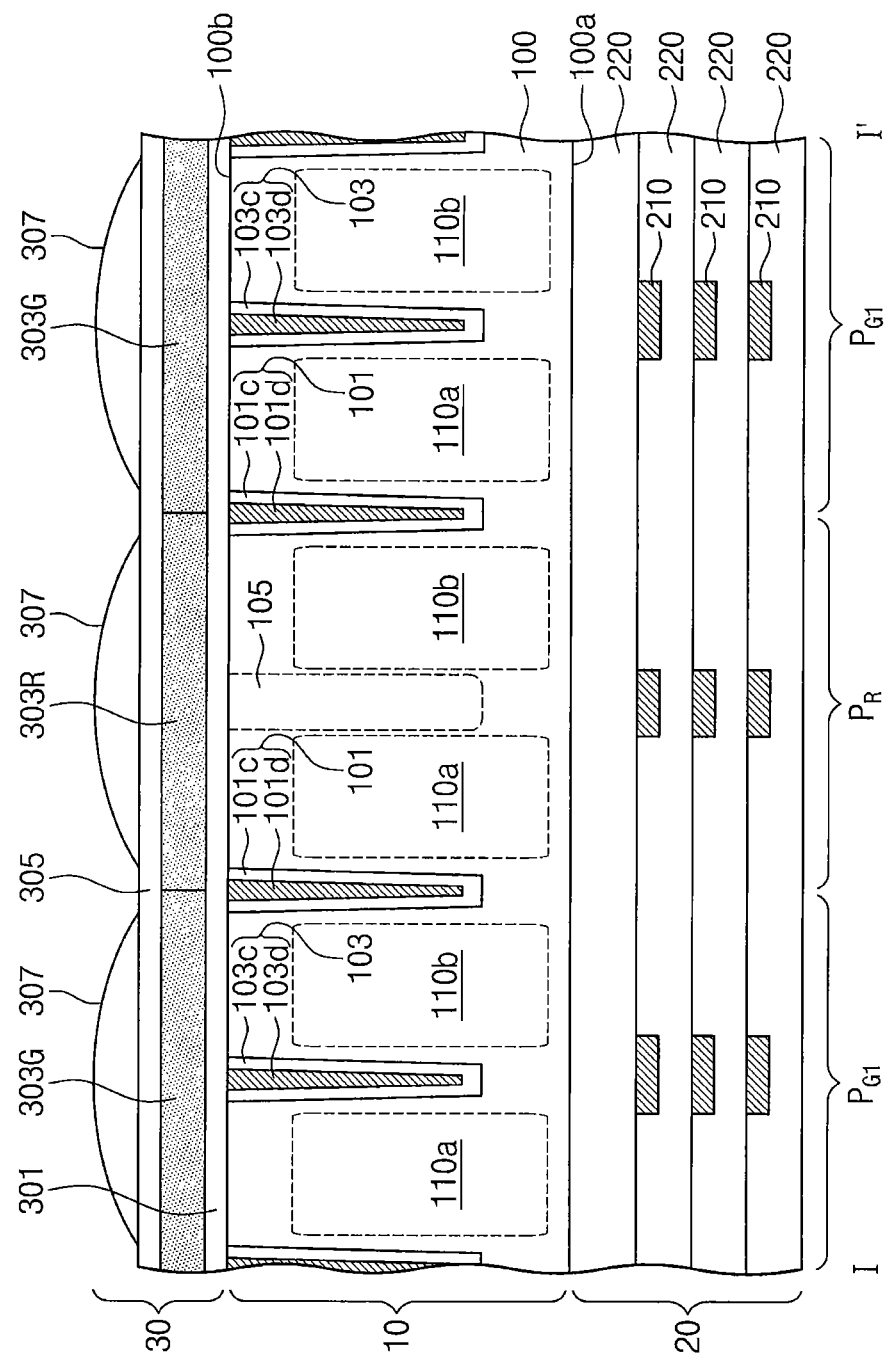

Referring to FIG. 7F, the device separation layer 101 may include first and second separation layers 101c and 101d, whose refractive indices are different from each other. The first separation layer 101c may be in contact with the semiconductor substrate 100, and the second separation layer 101d may be provided in the first separation layer 101c. In the case where light is obliquely incident into the device separation layer 101, the light may be refracted at an interface between the first and second separation layers 101c and 101d, owing to a difference between their refractive indices. For example, the first separation layer 101c may be formed of or include an insulating material (e.g., silicon oxide or silicon nitride), and the second separation layer 101d may be formed of or include a conductive material (e.g., poly-silicon or metals).

In some example embodiments, the first isolation structure 103 may include first and second separation layers 103c and 103d, whose refractive indices are different from each other, like the device separation layer 101.

Figure 8A:
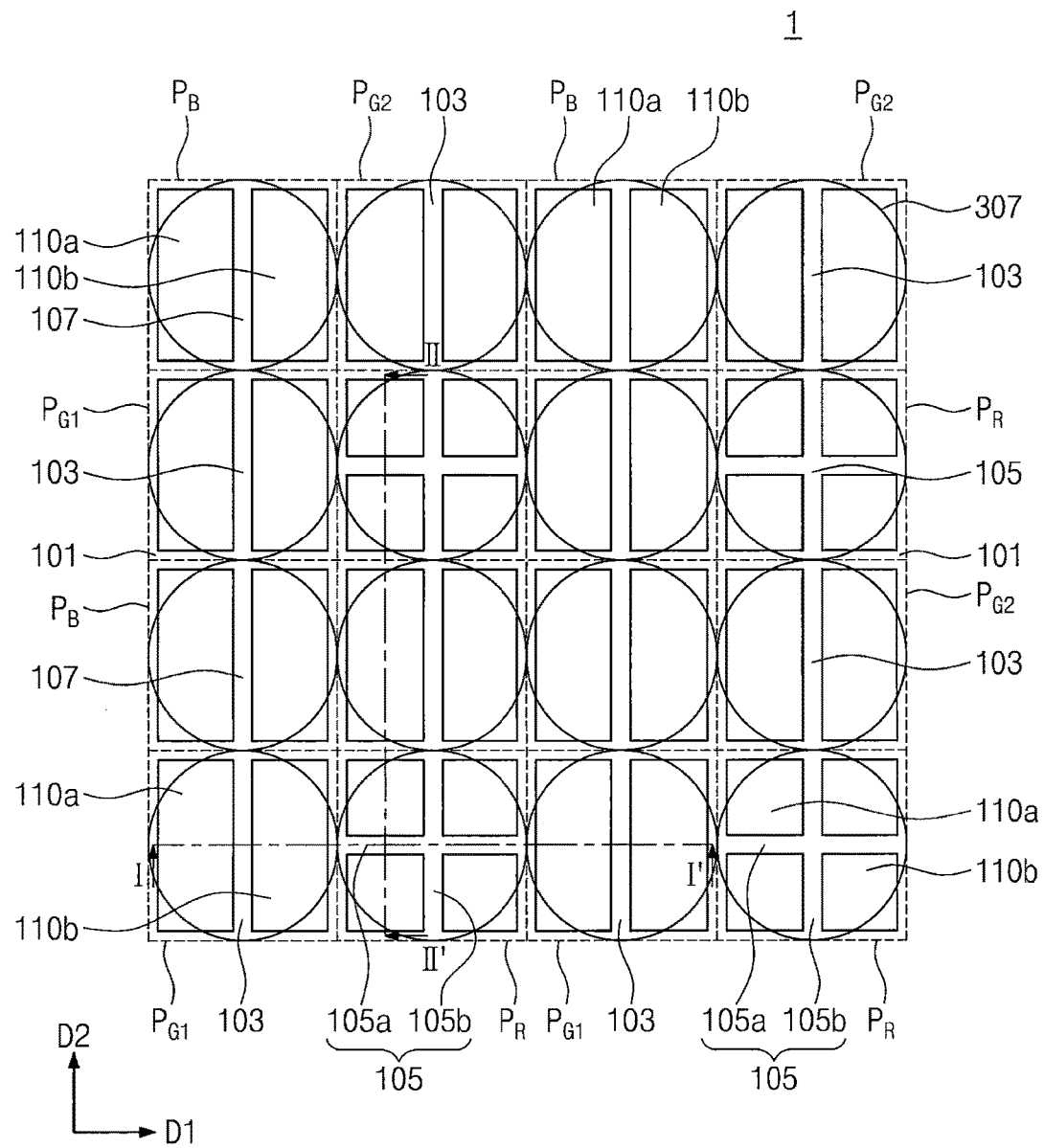
FIGS. 8A and 8B are plan views illustrating image sensors according to some example embodiments of the inventive concepts.
Figure 8B:
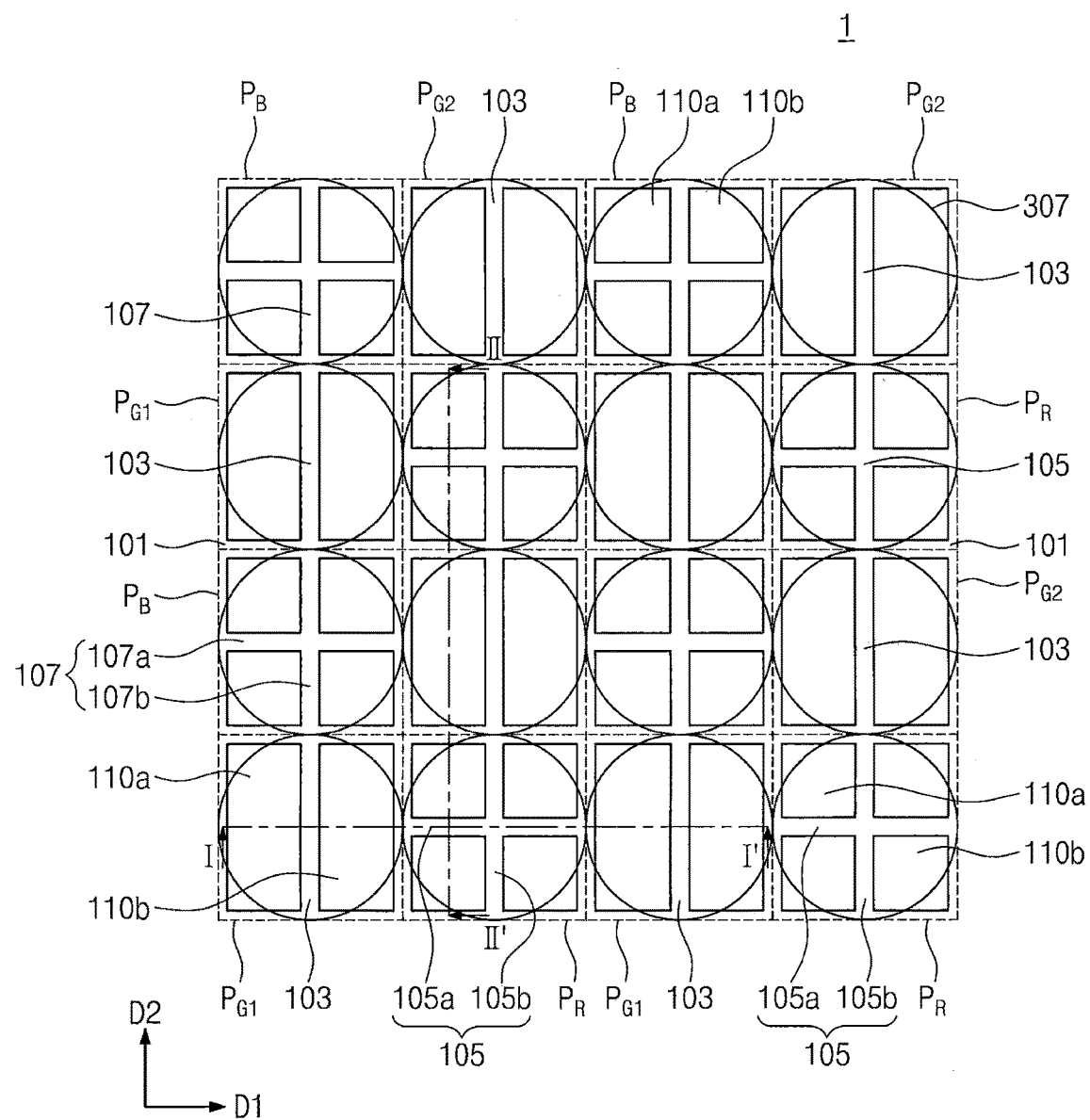
Figure 9:
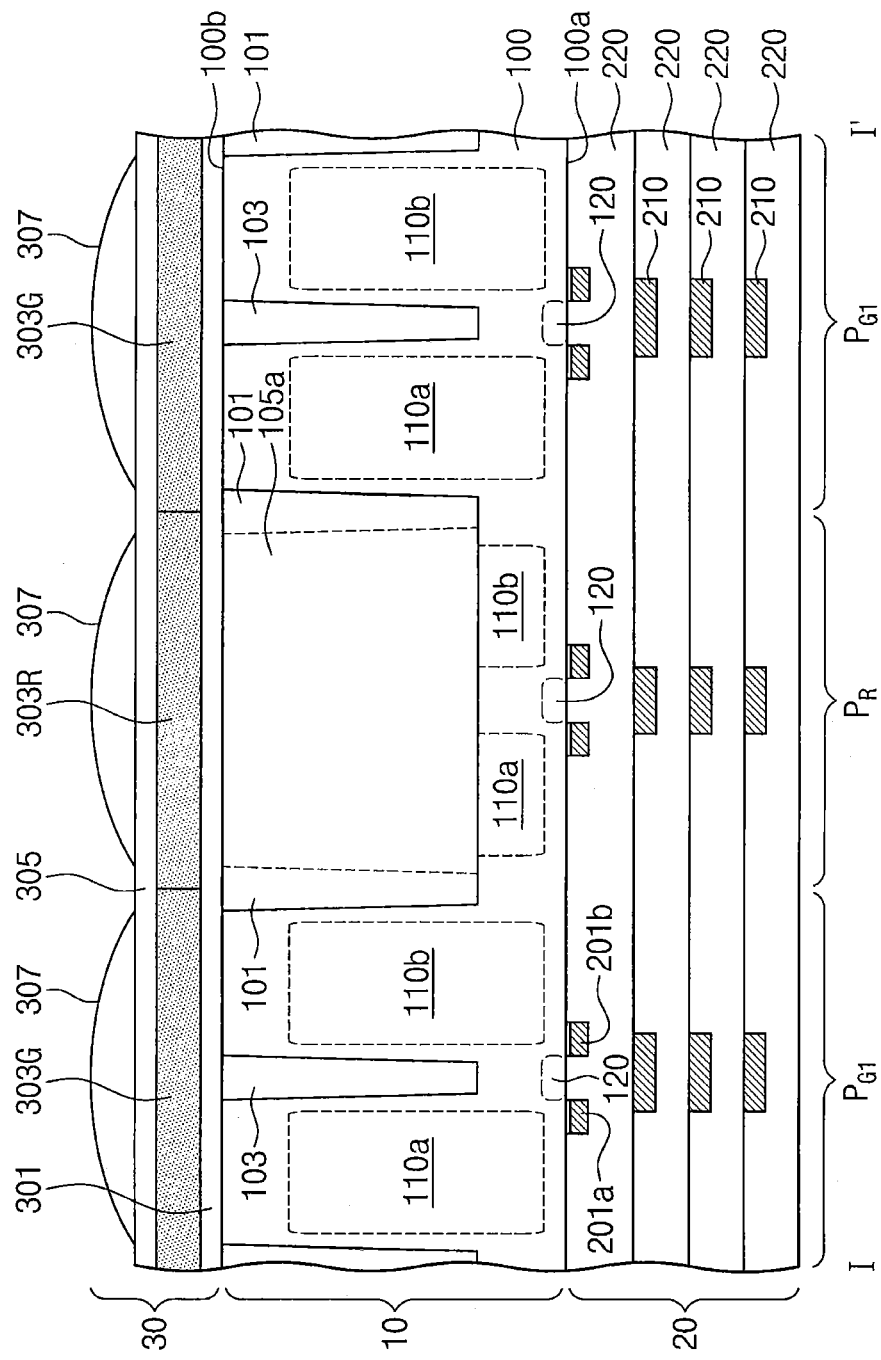
FIGS. 9 and 10 are sectional views, which are taken along lines I-I' and II-II', respectively, of FIG. 8A or 8B and illustrate image sensors according to some example embodiments of the inventive concepts.
Figure 10:
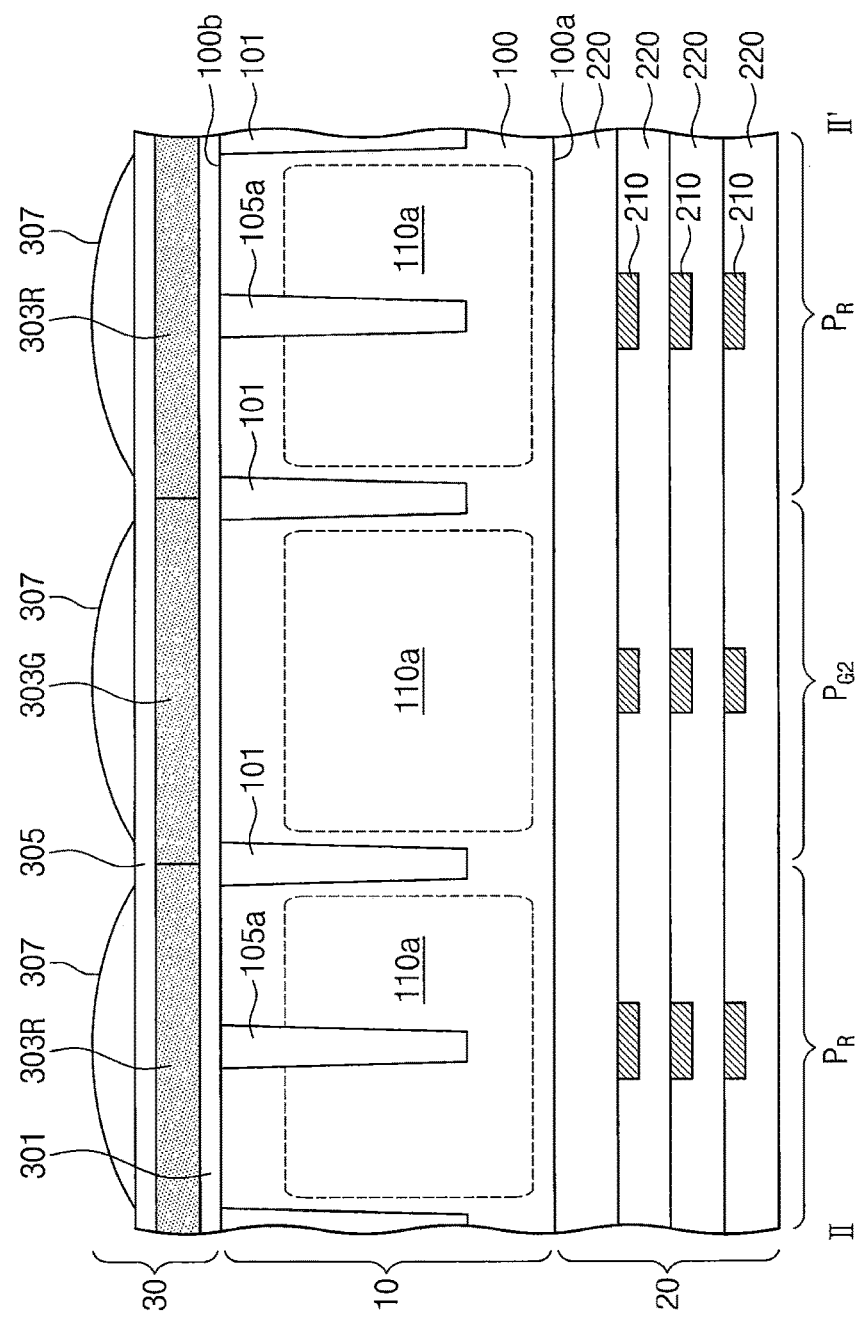

FIGS. 8A and 8B are plan views illustrating image sensors according to some example embodiments of the inventive concepts. FIGS. 9 and 10 are sectional views, which are taken along lines I-I' and II-II', respectively, of FIG. 8A or 8B and illustrate image sensors according to some example embodiments of the inventive concepts. For concise description, an element previously described with reference to FIGS. 5A, 5B, 6A, and 6B may be identified by a similar or identical reference number and repeated description thereof may be omitted.

Referring to FIGS. 8A, 8B, 9, and 10, the device separation layer 101 may define the first to third pixel regions $P_{G1}$, $P_{G2}$, $P_R$, and $P_B$ and to enclose each of the first to third pixel regions $P_{G1}$, $P_{G2}$, $P_R$, and $P_B$, when viewed in a plan view. As described with reference to FIG. 5C, the device separation layer 101 may include the first portions P1, which extend in the first direction D1 and are spaced apart from each other in the second direction D2, and the second portions P2, which extend in the second direction D2 and are spaced apart from each other in the first direction D1, when viewed in a plan view. Each of the first to third pixel regions $P_{G1}$, $P_{G2}$, $P_R$, and $P_B$ may be defined by a pair of the first portions P1 and a pair of the second portions P2. As described above, the first isolation structure 103 may be provided in each of the first pixel regions $P_{G1}$ and $P_{G2}$, the second isolation structure 105 may be provided in each of the second pixel regions $P_R$, and the third isolation structure 107 may be provided in each of the third pixel regions $P_B$.

The first isolation structure 103 may be may be substantially the same device separation layer 101 in terms of their structure and material, and when viewed in a plan view, it may extend in the second direction D2 to be connected to the device separation layer 101.

In some example embodiments, the second isolation structure 105 may have a shape different from the first isolation structure 103. The second isolation structure 105 may include a first portion 105a extending along the first direction D1 and a second portion 105b extending along the second direction D2, when viewed in a plan view. For example, when viewed in a plan view, the first portion 105a of the second isolation structure 105 may cross the first and second photoelectric conversion regions 110a and 110b, and the second portion 105b of the second isolation structure 105 may be provided between the first and second photoelectric conversion regions 110a and 110b. Furthermore, the second isolation structure 105 may include the same insulating material as the device separation layer 101.

In each of the second pixel regions $P_R$, a portion of the first photoelectric conversion region 110a may be positioned between the first portion 105a of the second isolation structure 105 and the first surface 100a of the semiconductor substrate 100. Similarly, in the second pixel regions $P_R$, a portion of the second photoelectric conversion region 110b may be positioned between the first portion 105a of the second isolation structure 105 and the first surface 100a of the semiconductor substrate 100.

In some example embodiments, the second isolation structure 105 may include the first portion 105a and the second portion 105b crossing each other, and thus, even if light to be incident into the second pixel regions $P_R$ is irregularly reflected by the second isolation structure 105, an amount of light propagating from the second pixel region $P_R$ toward the first pixel regions $P_{G1}$ and $P_{G2}$ may be the same in the first and second directions D1 and D2. Accordingly, it is possible to suppress or prevent a noise level from being changed by a positional difference between the first pixel regions $P_{G1}$ and $P_{G2}$.

The third isolation structure 107 may include the same insulating material as the device separation layer 101 and, when viewed in a plan view, it may extend in the second direction D2 to be connected to the device separation layer 101. As shown in FIG. 8A, when viewed in a plan view, the third isolation structure 107 may have substantially the same structure as the first isolation structure 103. In other words, when viewed in a plan view, the third isolation structure 107 may extend in the second direction D2 and may be formed of the same insulating material as the first isolation structure 103. In certain embodiments, as shown in FIG. 8B, when viewed in a plan view, the third isolation structure 107 may have substantially the same structure as the second isolation structure 105. In other words, when viewed in a plan view, the third isolation structure 107 may include a first portion 107a and a second portion 107b crossing each other.

Figure 11A:
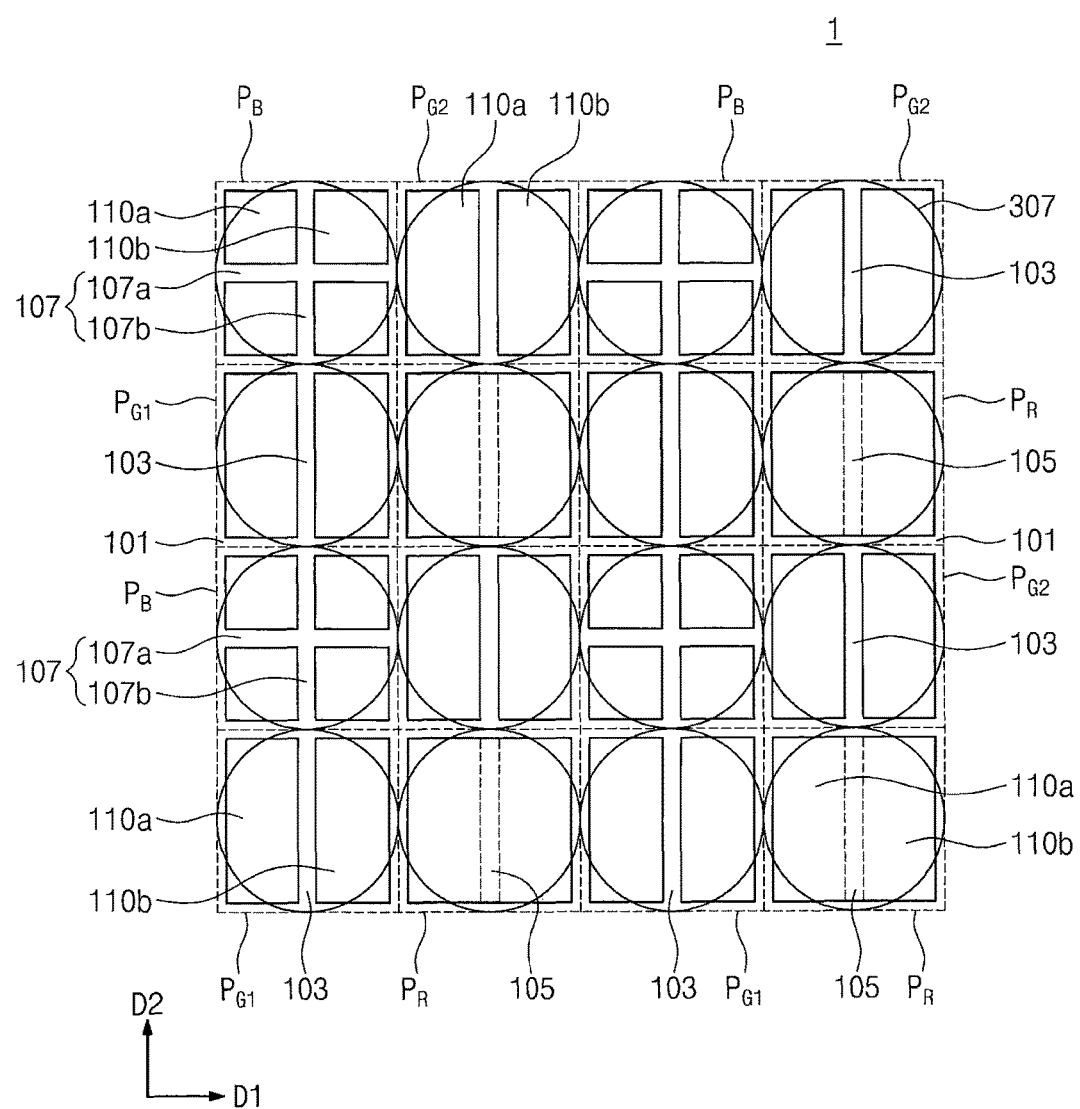
FIGS. 11A and 11B are plan views illustrating image sensors according to some example embodiments of the inventive concepts.
Figure 11B:
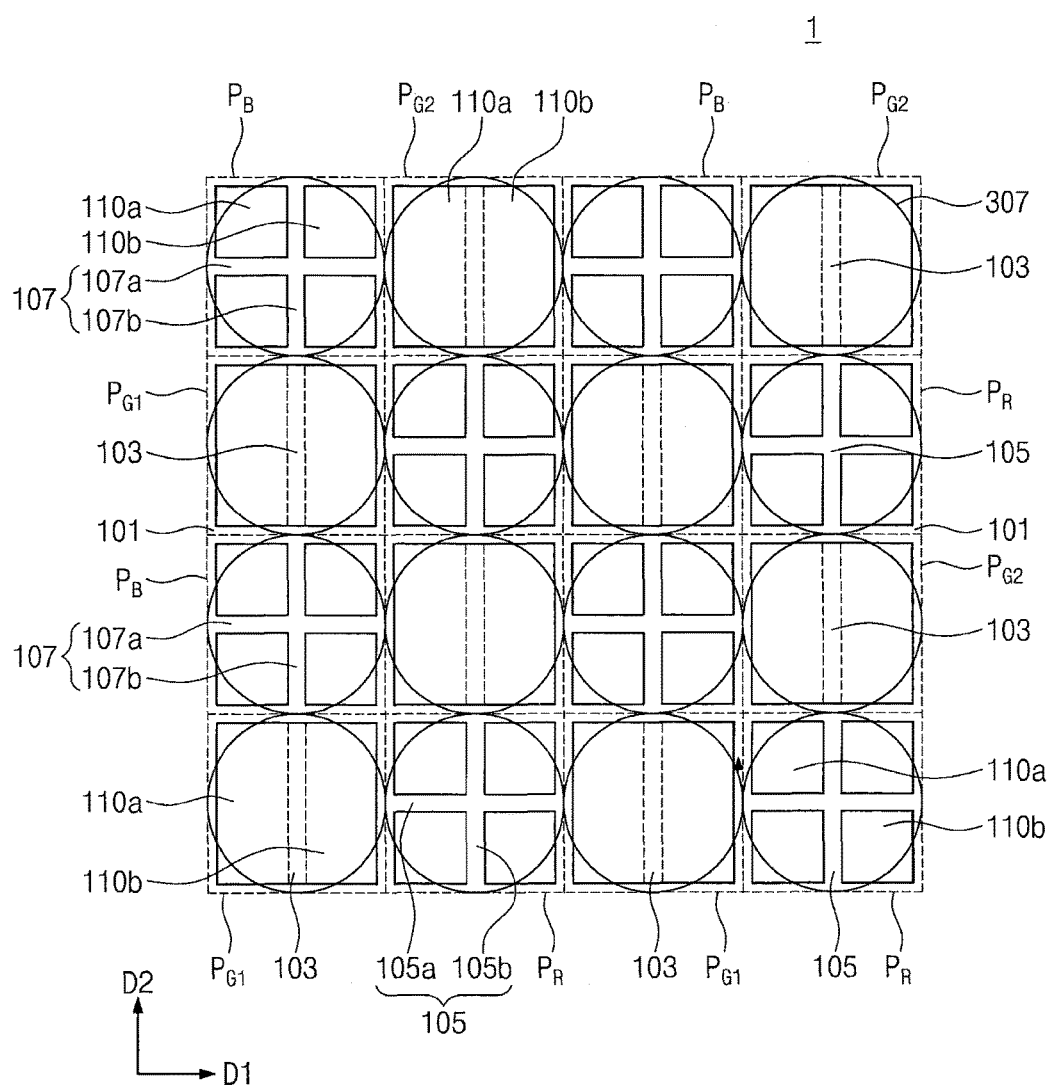

FIGS. 11A and 11B are plan views illustrating image sensors according to some example embodiments of the inventive concepts. For concise description, an element previously described with reference to FIGS. 5A, 5B, 6A, and 6B may be identified by a similar or identical reference number and repeated description thereof may be omitted.

Referring to FIGS. 11A and 11B, as described with reference to FIG. 5C, the device separation layer 101 may include the first portions P1, which extend in the first direction D1 and are spaced apart from each other in the second direction D2, and the second portions P2, which extend in the second direction D2 and are spaced apart from each other in the first direction D1, when viewed in a plan view. Each of the first to third pixel regions $P_{G1}$, $P_{G2}$, $P_R$, and $P_B$ may be defined by a pair of the first portions P1 and a pair of the second portions P2. As described above, the first isolation structure 103 may be provided in each of the first pixel regions $P_{G1}$ and $P_{G2}$, the second isolation structure 105 may be provided in each of the second pixel regions $P_R$, and the third isolation structure 107 may be provided in each of the third pixel regions $P_B$.

According to embodiments shown in FIG. 11A, the first isolation structure 103 may include the same insulating material as the device separation layer 101 and, when viewed in a plan view, it may extend in the second direction D2 to be connected to the device separation layer 101.

The second isolation structure 105 may include a material different from the first and third isolation structures 103 and 107, and the third isolation structure 107 may have a shape different from the first and second isolation structures 103 and 105. For example, as shown in FIG. 11A, the second isolation structure 105 may be a doped region of the first conductivity type, and the third isolation structure 107 may include the first portion 107a extending along the first direction D1 and the second portion 107b extending along the second direction D2.

According to embodiments shown in FIG. 11B, the first isolation structure 103 may be a doped region of the first conductivity type, and when viewed in a plan view, it may extend in the second direction D2 to be connected to the device separation layer 101. The second isolation structure 105 may include the first portion 105a extending along the first direction D1 and the second portion 105b extending along the second direction D2. Similarly, the third isolation structure 107 may include the first portion 107a extending along the first direction D1 and the second portion 107b extending along the second direction D2.

Figure 12:
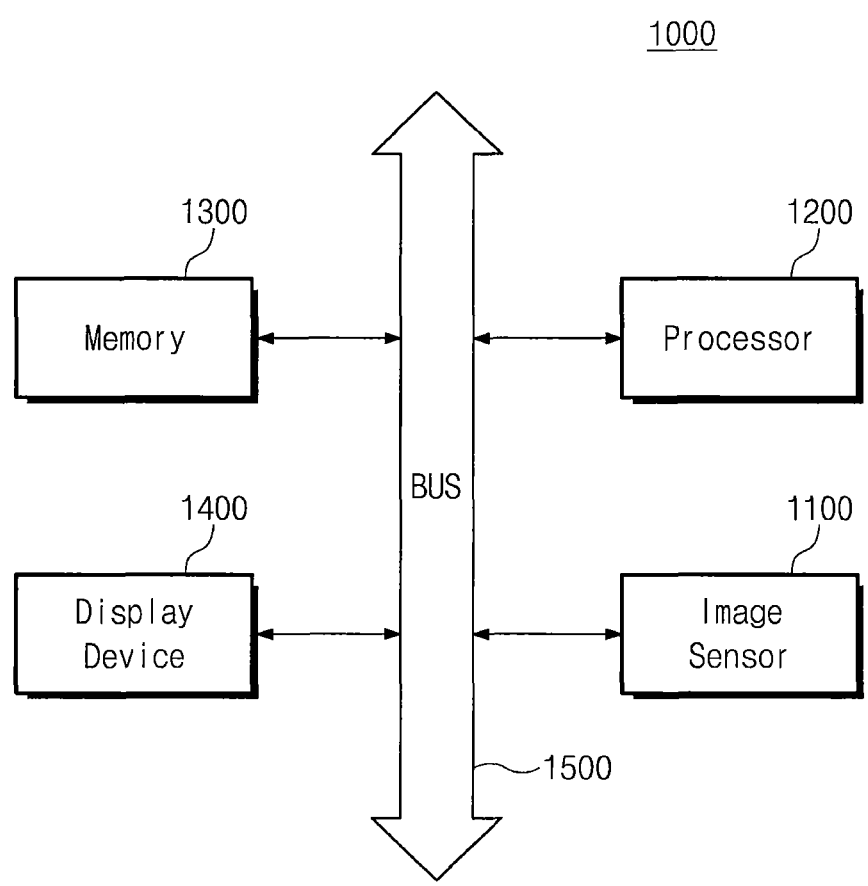
FIG. 12 is a block diagram illustrating an example of an electronic device including an image sensor according to some example embodiments of the inventive concepts.

FIG. 12 is a schematic block diagram illustrating an example of processor-based systems including an image sensor according to some example embodiments of the inventive concepts.

Referring to FIG. 12, a processor-based system 1000 may include an image sensor 1100, a processor 1200, a memory 1300, a display 1400, and a bus 1500. The image sensor 1100 may capture external images in response to control signals of the processor 1200. The processor 1200 may store the captured image in the memory 1300 through the bus 1500. The processor 1200 may output the image stored in the memory 1300 to display the image on the display 1400.

The processor-based system 1000 may include computer systems, camera systems, scanners, machined watch systems, navigation systems, videophones, monitoring systems, automatic focus systems, tracking systems, motion monitoring systems, and image stabilization systems, but are not limited thereto. Furthermore, in the case where the processor-based system 1000 is applied for mobile devices, a battery may be further provided to supply an operation power to the mobile devices.

Figure 13:
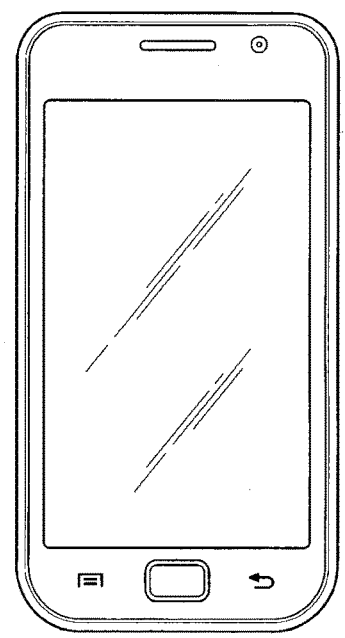
FIGS. 13 and 14 illustrate electronic devices including an image sensor according to some example embodiments of the inventive concepts.
Figure 14:
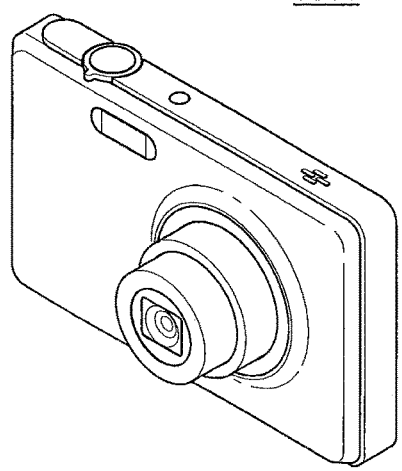

FIGS. 13 and 14 illustrate some examples of an imaging device, in which an image sensor according to some example embodiments of the inventive concepts is provided.

An image sensor according to some example embodiments of the inventive concepts can be applied for a variety of electronic devices with an imaging function. For example, the image sensor according to some example embodiments of the inventive concepts may be applied for a mobile or smart phone 2000 as shown in FIG. 13 or for a digital camera 3000 or a digital camcorder as shown in FIG. 14.

Alternatively, the image sensor may be used for a personal digital assistant (PDA), a portable multimedia player (PMP), a digital multimedia broadcast (DMB) device, a global positioning system (GPS), a handheld gaming console, a portable computer, a web tablet, a wireless phone, a digital music player, a memory card, or other electronic products, which may be configured to receive or transmit information data wirelessly.

According to some example embodiments of the inventive concepts, first pixel regions may be disposed to be adjacent to second pixel regions in first and second directions crossing each other, and when light is refracted and reflected by the second pixel regions and is incident to the first pixel regions adjacent thereto, an amount of light to be incident into the first pixel region in the first direction may become substantially the same as that in the second direction. In other words, although crosstalk phenomenon occurs between the first and second pixel regions adjacent to each other, it is possible to reduce a difference between the cross-talk phenomena in the first and second directions. Accordingly, it is possible to suppress or prevent a noise level from being dependent on orientation between the first and second pixel regions.

While some example embodiments of the inventive concepts have been particularly shown and described, it will be understood by one of ordinary skill in the art that variations in form and detail may be made therein without departing from the spirit and scope of the attached claims.

What is claimed is:

1. An image sensor, comprising:
   a semiconductor substrate of a first conductivity type;
   a device separation layer disposed in the semiconductor substrate and defining first pixel regions and second pixel regions therein;
   respective pairs of first and second photoelectric conversion devices of a second conductivity type disposed in the semiconductor substrate in respective ones of the first and second pixel regions;
   respective first isolation structures disposed in the semiconductor substrate between the first and second photoelectric conversion devices in respective ones of the first pixel regions; and
   respective second isolation structures disposed in the semiconductor substrate between the first and second photoelectric conversion devices in respective ones of the second pixel regions, the second isolation structures being different from the first isolation structures in terms of their refractive indices and/or shapes, wherein the first and second pixel regions are arranged in a matrix along first and second orthogonal directions and wherein the second pixel regions are disposed between adjacent ones of the first pixel regions in the first direction and between adjacent ones of the first pixel regions in the second direction.

2. The image sensor of claim 1, wherein the first isolation structures comprise insulating layers having a line-shaped structure extending along the second direction, and wherein the second isolation structures comprise line-shaped structures extending along the second direction and include impurity regions including dopants of the first conductivity type.

3. The image sensor of claim 1, wherein the first isolation structures comprise insulating layers having a line-shaped structure extending along the second direction, and wherein the second isolation structures comprise insulating layers including first portions extending along the first direction and second portions extending along the second direction.

4. The image sensor of claim 1, wherein the device separation layer comprises first portions extending along the first direction and spaced apart from each other along the second direction, and second portions extending along the second direction and spaced apart from each other along the first direction, and wherein the first and second isolation structures extend along the second direction to contact the first portions of the device separation layer.

5. The image sensor of claim 1, wherein, in the first pixel regions, the first and second photoelectric conversion devices are individually enclosed by the device separation layer and the first isolation structures and wherein, in the second pixel regions, the first and second photoelectric conversion devices are individually enclosed by the device separation layer and the second isolation structures.

6. The image sensor of claim 1, wherein the semiconductor substrate has a first surface and a second surface on first and second opposite sides thereof, wherein the device separation layer has a bottom surface spaced apart from the second surface of the semiconductor substrate by a first distance, wherein the second isolation structures have bottom surfaces spaced apart from the second surface of the semiconductor substrate by second distance, and wherein the second distance is substantially the same as the first distance.

7. The image sensor of claim 6, wherein the first isolation structures have bottom surfaces spaced apart from the second surface of the semiconductor substrate by the first distance.

8. The image sensor of claim 1, wherein the semiconductor substrate further comprises third pixel regions defined by the device separation layer and disposed in a diagonal direction to the second pixel regions between adjacent ones of the first pixel regions along the first direction and between adjacent ones of the first pixel regions along the second direction, and wherein the image sensor further comprises third isolation structures disposed in the semiconductor substrate between the first and second photoelectric conversion devices in respective ones of the third pixel regions.

9. The image sensor of claim 8, wherein the third isolation structures have the same material composition or shape as the first isolation structures.

10. The image sensor of claim 8, wherein the third isolation structures have the same material composition or shape as the second isolation structures.

11. The image sensor of claim 8, wherein the third isolation structures have a different material composition or shape than the first and second isolation structures.

12. The image sensor of claim 8, wherein the first and third isolation structures comprise insulating layers having a line-shaped structure extending along the second direction and wherein the second isolation structures have a line-shaped structure extending along the second direction and include impurity regions including dopants of the first conductivity type.

13. The image sensor of claim 8, wherein the first isolation structures comprise insulating layers having a line-shaped structure extending along the second direction and wherein the second and third isolation structures have a line-shaped structure extending along the second direction and include impurity regions including dopants of the first conductivity type.

14. The image sensor of claim 8, wherein the first and third isolation structures comprise insulating layers having a line-shaped structure extending along the second direction, and wherein the second isolation structures comprise insulating layers including first portions extending along the first direction and second portions extending along the second direction.

15. The image sensor of claim 8, wherein the first isolation structures comprise insulating layers having a line-shaped structure extending along the second direction, wherein the second and third isolation structures comprise insulating layers, and wherein the insulating layers of the second isolation structures comprise first portions extending along the first direction and second portions extending along the second direction.

16. An image sensor comprising:
a semiconductor substrate;
a first pair of photoelectric conversion regions in a first pixel region of the substrate;
a first isolation structure between the photoelectric conversion regions of the first pair of photoelectric conversion regions;
a second pair of photoelectric conversion regions in a second pixel region of the substrate adjacent the first pixel region; and
a second isolation structure between the photoelectric conversion regions of the second pair of photoelectric conversion regions and having different optical properties than the first isolation structure.

17. The image sensor of claim 16, comprising first and second different color filters on respective ones of the first and second pixel regions.

18. The image sensor of claim 16, wherein the first isolation structure comprises an insulating region in a trench in the substrate between the photoelectric conversion regions of the first pair of photoelectric conversion regions and wherein the second isolation structure comprises a doped region in the substrate between the photoelectric conversion regions of the second pair of photoelectric conversion regions.

19. The image sensor of claim 16, wherein the first isolation structure comprises multiple layers having different refractive indices disposed in a first trench in the substrate between the photoelectric conversion regions of the first pair of photoelectric conversion regions and wherein the second isolation structure comprises a doped region in the substrate between the photoelectric conversion regions of the second pair of photoelectric conversion regions.

20. The image sensor of claim 16, wherein the first isolation structure comprises a first insulating region in a first trench in the substrate between the photoelectric conversion regions of the first pair of photoelectric conversion regions and wherein the second isolation structure comprises a second insulation region in a second trench in the substrate between the photoelectric conversion regions of the second pair of photoelectric conversion regions and a third insulating region in a third trench crossing the second trench and partially extending into the photoelectric conversion regions of the second pair of photoelectric conversion regions.

* * * * *